US012707612B2

(12) United States Patent
Manuilov et al.

(10) Patent No.: US 12,707,612 B2
(45) Date of Patent: Aug. 11, 2026

(54) ELECTROMAGNETIC CONTROL ARTICLES

(71) Applicant: 3M INNOVATIVE PROPERTIES COMPANY, St. Paul, MN (US)

(72) Inventors: Sergei A. Manuilov, Bayport, MN (US); Ivan Lemesh, Minneapolis, MN (US); Jaewon Kim, Woodbury, MN (US); Joseph B. Eckel, Vadnais Heights, MN (US); Michael S. Graff, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 18/575,410

(22) PCT Filed: Jun. 28, 2022

(86) PCT No.: PCT/IB2022/056005
§ 371 (c)(1),
(2) Date: Dec. 29, 2023

(87) PCT Pub. No.: WO2023/275750
PCT Pub. Date: Jan. 5, 2023

(65) Prior Publication Data

US 2024/0314991 A1 Sep. 19, 2024

Related U.S. Application Data

(60) Provisional application No. 63/202,926, filed on Jun. 30, 2021.

(51) Int. Cl.
*H01Q 17/00* (2006.01)
*H01Q 3/46* (2006.01)
(Continued)

(52) U.S. Cl.
CPC ............ *H05K 9/0081* (2013.01); *H01Q 3/46* (2013.01); *H01Q 15/14* (2013.01); *H01Q 17/00* (2013.01); *H01Q 17/007* (2013.01)

(58) Field of Classification Search
CPC .......................... H01Q 17/008; H01Q 17/007
See application file for complete search history.

(56) References Cited

U.S. PATENT DOCUMENTS 4,602,229 A * 7/1986 Yester, Jr. ........... H01P 1/20309 333/204
4,948,922 A 8/1990 Varadan et al.
(Continued)

FOREIGN PATENT DOCUMENTS

CN 110519975 A 1/2021
CN 109786973 A 3/2021
(Continued)

OTHER PUBLICATIONS

International Search Report for PCT International Application No. PCT/IB2022/056005, mailed on Sep. 29, 2022, 3 pages.

*Primary Examiner* — Hung V Ngo
(74) *Attorney, Agent, or Firm* — Christopher P. Tebow; Robert S. Moshrefzadeh

(57) ABSTRACT

Articles to control an electromagnetic (EM) radiation in the range of 1 GHz to 100 GHz, and methods of making and using the same are provided. An EM controlling sheet structure includes a dielectric carrier layer and an array of metallic resonant elements supported by the dielectric carrier layer to form an EM metamaterial structure in a non-random pattern. The metallic resonant elements are oriented such that each metallic resonant element has an axis substantially parallel to each other and substantially parallel to a major plane of the dielectric carrier layer.

18 Claims, 17 Drawing Sheets

(51) Int. Cl.
*H01Q 15/14* (2006.01)
*H05K 9/00* (2006.01)

(56) References Cited

U.S. PATENT DOCUMENTS

| | | | | |
|---|---|---|---|---|
| 5,179,381 | A * | 1/1993 | Hatakeyama .......... H01Q 17/00 523/137 |
| 5,229,773 | A | 7/1993 | Dauwen et al. |
| 8,347,486 | B1 | 1/2013 | Steigerwald et al. |
| 8,902,115 | B1 * | 12/2014 | Loui .................. H01Q 15/0086 343/785 |
| 2004/0008147 | A1 | 1/2004 | Killen et al. |
| 2006/0152430 | A1 | 7/2006 | Seddon et al. |
| 2007/0171120 | A1 | 7/2007 | Puscasu et al. |
| 2010/0001894 | A1 * | 1/2010 | Holly ........................ G01S 7/02 343/810 |

FOREIGN PATENT DOCUMENTS

| | | | |
|---|---|---|---|
| CN | 112928492 | A | 10/2022 |
| WO | 199004210 | A1 | 4/1990 |

* cited by examiner

ELECTROMAGNETIC CONTROL ARTICLES

CROSS REFERENCE TO RELATED APPLICATIONS

This application is a national stage filing under 35 U.S.C. 371 of PCT/IB2022/056005, filed Jun. 28, 2022, which claims the benefit of U.S. Provisional Application No. 63/202,926, filed June 30,2021, the disclosures of which are incorporated by reference in their entireties herein.

BACKGROUND

There is a limited set of naturally occurring electromagnetic (EM) control materials in centimeter waves or cmWave (e.g., WiFi, the fourth generation technology standard or 4G) and millimeter waves or mmWave (e.g., the fifth generation technology standard or 5G) frequency range. Electromagnetic (EM) metamaterials, specifically engineered materials which allow for multifunctionality, have been actively explored as an alternative solution to well-known composite and ceramic EM control materials. EM metamaterials have been used in absorbers, beam steering applications, antennas, etc.

SUMMARY

The present disclosure provides electromagnetic (EM) metamaterial devices including an array of metallic resonant elements, and the methods of making and using the same. In one aspect, the present disclosure provides a method of making a sheet structure to control an electromagnetic (EM) radiation in the range of 1 GHz to 100 GHz. The method includes providing a transfer tool including an array of pockets on a major surface thereof: disposing a plurality of metallic resonant elements in the array of pockets of the transfer tool: contacting an adhesive surface of a dielectric carrier layer to the plurality of metallic resonant elements in the array of pockets on the major surface of the transfer tool; and removing the dielectric carrier layer along with the plurality of metallic resonant elements from the major surface of the transfer tool. The plurality of metallic resonant elements is disposed on the dielectric carrier layer in a non-random pattern, and the plurality of metallic resonant elements is oriented such that each metallic resonant element has an axis substantially parallel to each other and substantially parallel to a major plane of the dielectric carrier layer.

In another aspect, the present disclosure provides an electromagnetic (EM) controlling sheet structure including a dielectric carrier layer comprising an adhesive surface; and a plurality of metallic resonant elements attached to the adhesive surface of the dielectric carrier layer to form an EM metamaterial structure in a non-random pattern. The plurality of metallic resonant elements is oriented such that each metallic resonant element has an axis substantially parallel to each other and substantially parallel to a major plane of the dielectric carrier layer.

In another aspect, the present disclosure provides a method of making a sheet structure to control an electromagnetic (EM) radiation in the range of 1 GHz to 100 GHz. The method includes providing a transfer tool including an array of pockets on a major surface thereof: disposing a dielectric carrier layer on the transfer tool, wherein the dielectric carrier layer includes an array of through holes aligned with the pockets of the transfer tool: transferring, via the array of pockets of the transfer tool, a plurality of metallic resonant elements into the array of through holes of the dielectric carrier layer: providing a support layer to support the dielectric carrier layer along with the plurality of resonant elements: providing a cover layer to secure the resonant elements at least partially inside the through holes of the dielectric carrier layer; and removing the transfer tool from the dielectric carrier layer. The plurality of metallic resonant elements is disposed in the array of through holes of the dielectric carrier layer in a non-random pattern, and the plurality of metallic resonant elements is oriented such that each metallic resonant element has an axis substantially parallel to each other and substantially parallel to a major plane of the dielectric carrier layer.

In another aspect, the present disclosure provides an electromagnetic (EM) controlling sheet structure including a dielectric carrier layer comprising an array of through holes: a plurality of metallic resonant elements received by the through holes of the dielectric carrier layer to form an EM metamaterial structure in a non-random pattern; and a securing layer disposed on the dielectric carrier layer to secure the metallic resonant elements in the through holes. The plurality of metallic resonant elements is oriented such that each metallic resonant element has an axis substantially parallel to each other and substantially parallel to a major plane of the dielectric carrier layer.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

As used herein, the term "resonant element" refers to a three-dimensional (3D) metallic element which possess resonance response to EM wave.

As used herein, the term "metamaterial" or "metamaterial structure" refers to structures made of "resonant elements" particularly arranged in space to perform desired EM function, for example, to absorb, steer, reflect, or radiate EM wave.

As used herein, the term "polymer" refers to a polymeric material that is a homopolymer, copolymer, terpolymer, or the like. As used herein, the term "homopolymer" refers to a polymeric material that is the reaction product of a single monomer. As used herein, the term "copolymer" refers to a polymeric material that is the reaction product of two different monomers and the term "terpolymer" refers to a polymeric material that is the reaction product of three different monomers.

Figure 1A:
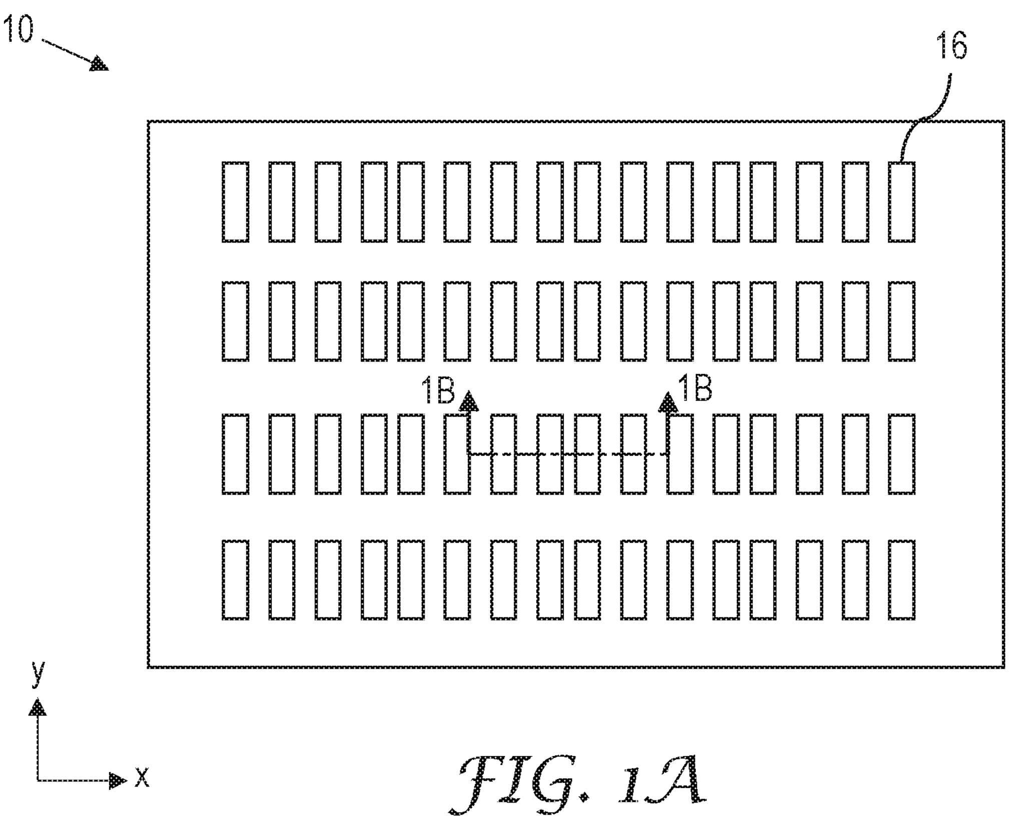
FIG. 1A is a top view of an article, according to one embodiment.
Figure 1B:
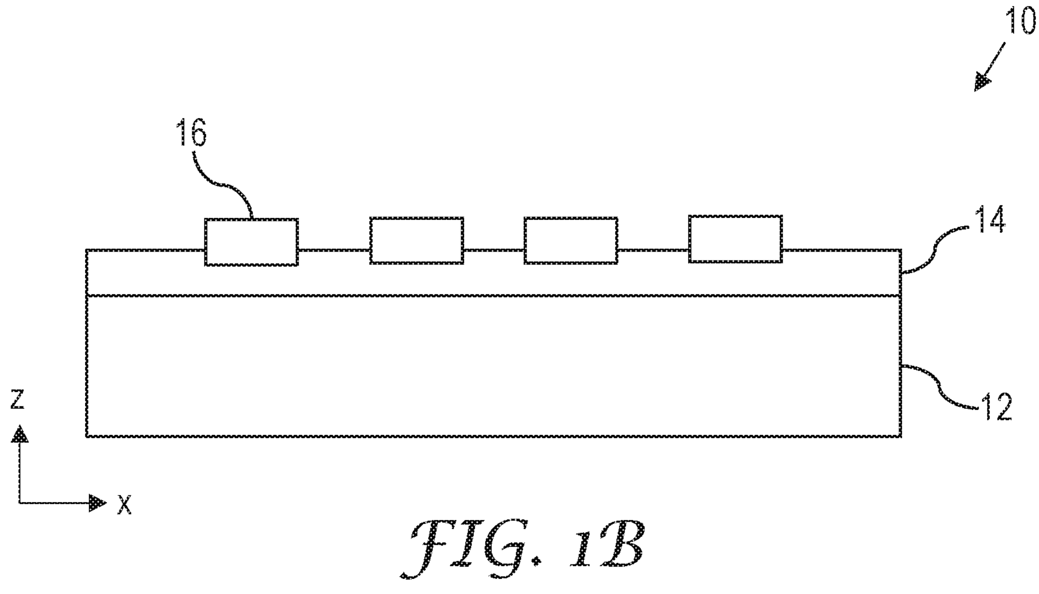
FIG. 1B is a cross-sectional view of the article of FIG. 1A, according to one embodiment.

FIG. 1A is a top view of an electromagnetic (EM) metamaterial article 10, according to one embodiment. FIG. 1B is a cross-sectional view of the article 10 of FIG. 1A. The article 10 has a sheet structure configured to control incident electromagnetic (EM) waves. The sheet structure 10 includes a dielectric carrier layer 12 including an adhesive surface 14 on one side. An array of metallic resonant elements 16 is attached to the adhesive surface 14 of the dielectric carrier layer 12 to form an EM metamaterial structure in a non-random pattern. The array of metallic resonant elements 16 each extends along an axis thereof and is oriented such that each metallic resonant element has its axis substantially parallel to each other and substantially parallel to a major plane of the dielectric carrier layer 12.

Figures 2, 3:
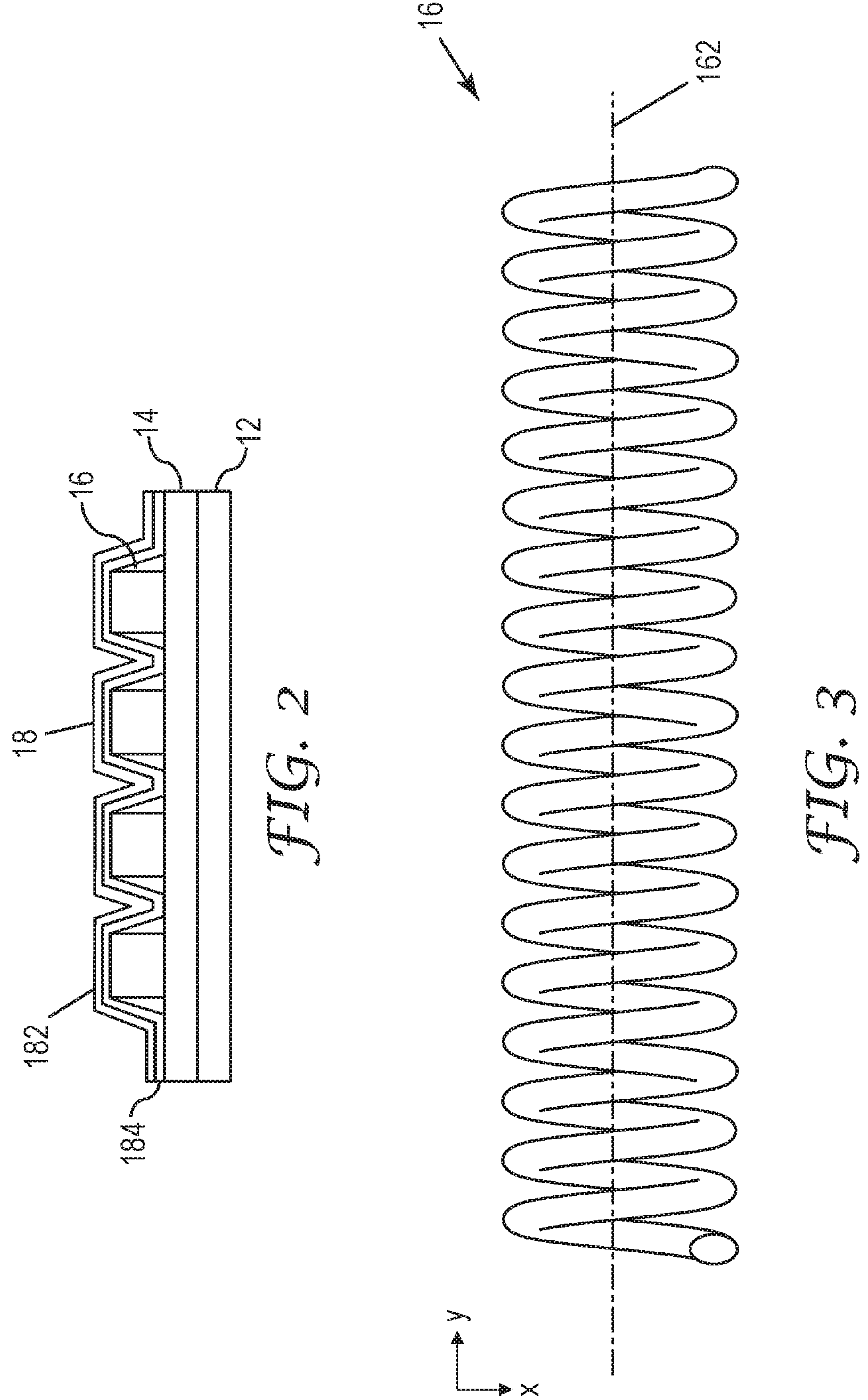
FIG. 2 is a cross-sectional view of an article, according to another embodiment.
FIG. 3 is a side perspective view of a helical element, according to one embodiment.

In the embodiment depicted in FIG. 2, the article further includes a cover layer 18 attached to the dielectric carrier layer 12 to cover the pattern of metallic resonant elements 16. In some embodiments, the cover layer 18 may include a polymer film 182 attached to the adhesive surface 14 of the dielectric carrier layer 12. The polymer film may include an adhesive material 184 to adhesively bond to the adhesive surface 14 of the dielectric carrier layer 12. It is to be understood that the cover layer 18 can be made of any suitable non-conductive, flexible material.

The EM controlling sheet structure of article 10 is configured to absorb EM radiation in the range, for example, from 1 GHz to 50 GHz. Main principles of operation of the structure may base on, for example, the resonant properties of metallic resonant elements 16, and the mutual coupling between the metallic resonant elements 16. As a good approximation, the resonant frequencies of a resonant element may be found using the standing wave relation $k*l=n*\pi$, where n is the eigen mode number, l is the conductive length of the resonant element and k is the propagation factor for EM wave. This results in the elements to be about a size of $\lambda/2$ of EM wave which can be in the cmWave and mmWave frequency ranges. In general, the resonant elements for EM wave the cmWave and mm Wave frequency ranges may have a lateral size (e.g., length, width, diameter) in the range from about $\lambda/100$ to $\lambda$.

The EM controlling sheet structure of article 10 may have any suitable lateral sizes, depending on the desired applications. In some embodiments, the sheet structure 10 may have a lateral size (e.g., length, or width), for example, being about 10 times to about 1000 times of the lateral size of the resonant element. The sheet structure, e.g., the dielectric carrier layer and the supported resonant elements, may have a thickness in the range, for example, from about 0.005 mm to about 10 mm.

A metallic resonant element described herein can be any suitable 3D metallic elements which possess resonance response to EM wave. Suitable 3D metallic elements may include, for example, a conductive helical element, a metallic spheroid or bead, a metal coated plastic or ceramic spheroid with or without a hole in the center, a conductive cylindrical element, etc. An exemplary metallic resonant element is a helical element. The helical element may include at least one of a conducting wire, a strand of polymer material coated with a conductive layer, or a biomaterial coated with a conductive layer. The conductive layer may have a thickness greater than a skin depth thereof at a frequency of operation. FIG. 3 is a side perspective view of an exemplary helical element 16, according to one embodiment. The helical elements each may have a conductive length, for example, about $\lambda/2$, in general, no less than $\lambda/4$, and no greater than $10\lambda$, where $\lambda$ is the free-space wavelength of a minimum frequency of operation. The conductive length of a helical element can be the length of conductive wire. The geometry of a helical element can be defined by a height, a pitch, an outer diameter (OD), an inner diameter (ID), a helix angle relative to the axis 162, etc.

The metallic resonant elements 16 may be arranged in a non-random pattern having the smallest repeating unit, i.e., a unit cell. The unit cell of the non-random pattern can have an in-plane dimension of length×width. The length may be measured along the axis of the metallic resonant element, and the width may be measured along an orthogonal direction. It is to be understood that the unit cell geometry or the pattern of the structure and the associated dimensions can be defined by a particular application. In some embodiments, it is typical to separate resonant elements by a distance no greater than $\lambda/2$, where $\lambda$ is the free-space wavelength of a minimum frequency of operation. It is to be understood that a non-random pattern can refer to any suitable non-random means arranged in space in a particular order defining electromagnetic functionality, including, for example, classical 2D latencies and complex patterns such as used in holographic or modulated metasurface antennas.

Figure 4B:
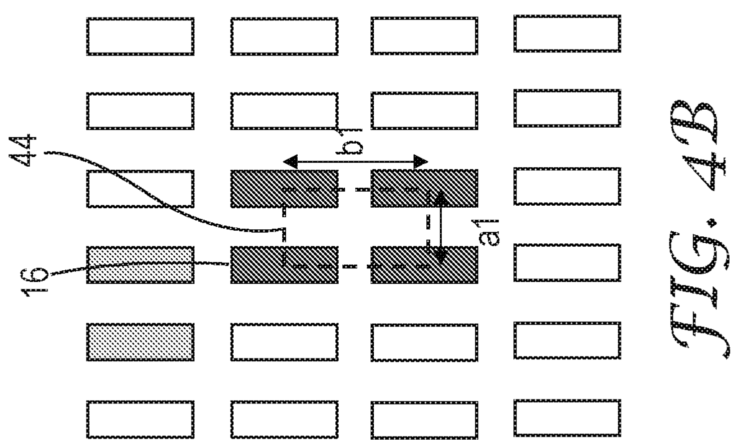
FIG. 4B is a schematic view of a pattern of metallic resonant element, according to another embodiment.
Figure 4A:
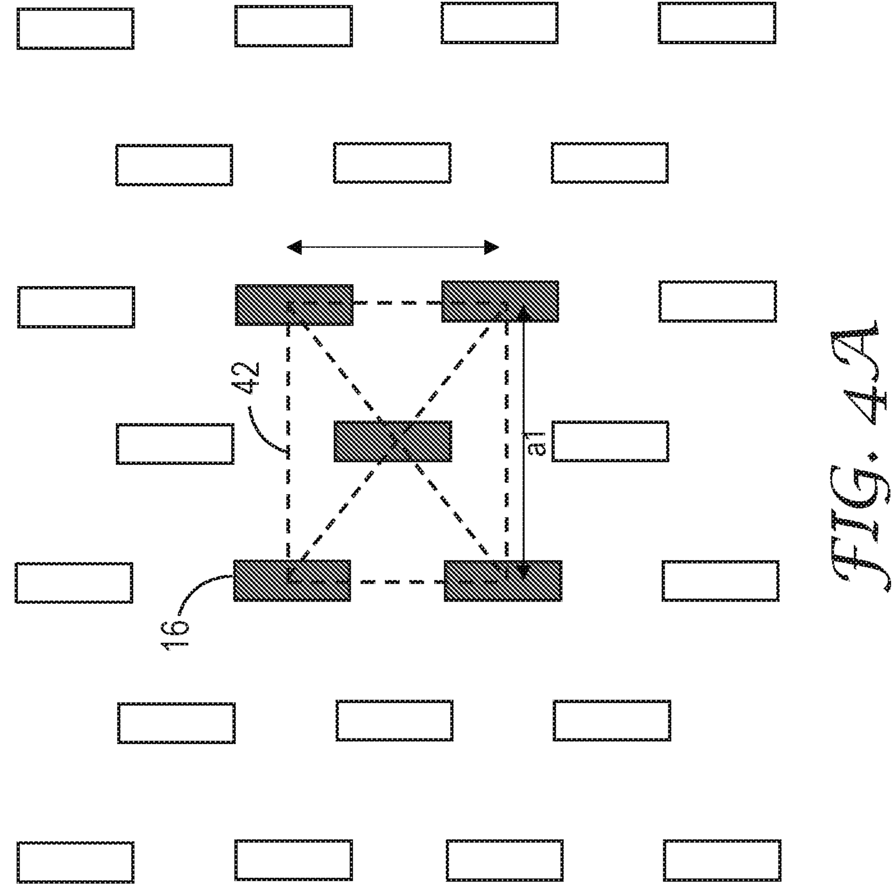
FIG. 4A is a schematic view of a pattern of metallic resonant element, according to one embodiment.
Figure 4D:
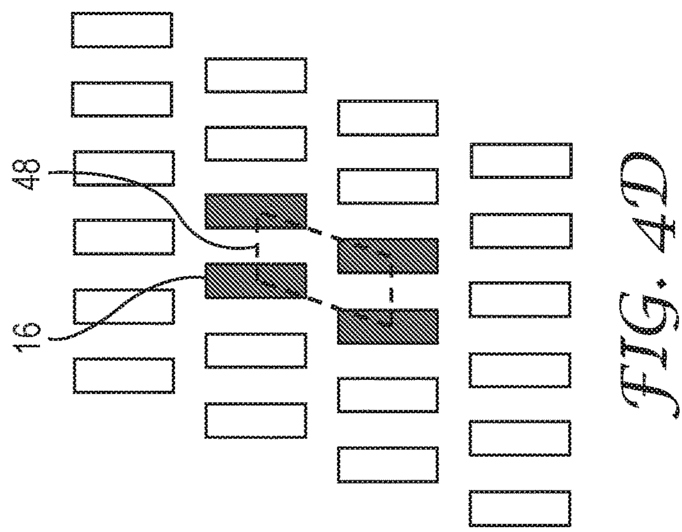
FIG. 4D is a schematic view of a pattern of metallic resonant element, according to another embodiment.
Figure 4C:
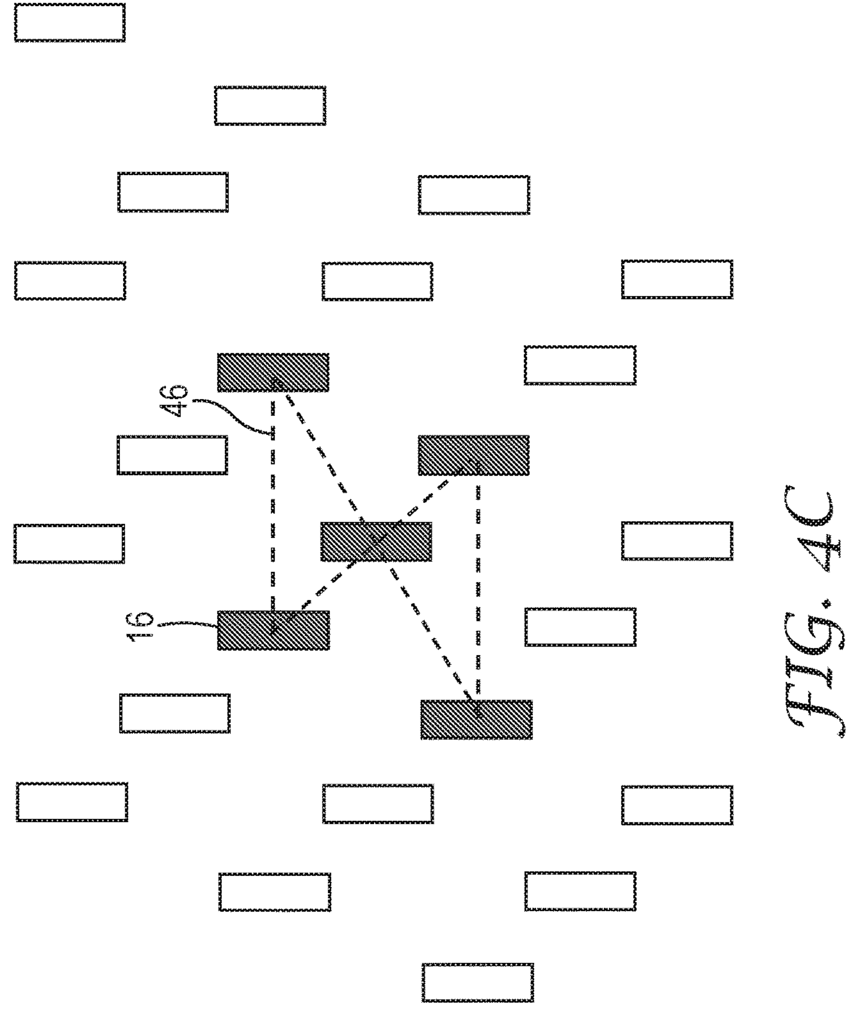
FIG. 4C is a schematic view of a pattern of metallic resonant element, according to one embodiment.

The non-random pattern of the metallic resonant elements 16 includes at least one of a simple rectangle (SR) pattern, a centered rectangle (CR) pattern, an oblique pattern, a hexagonal square pattern, a honeycomb pattern, etc. FIG. 4A illustrates a pattern of metallic resonant elements 16 having a centered rectangular unit cell 42. In one example, the unit cell 42 has an in-plane dimension of a1×b1=(4×helix OD)×(helix height+OD). FIG. 4B illustrates a pattern of metallic resonant elements 16 having a simple rectangular unit cell 44. In another example, the unit cell 44 has an in-plane dimension of a1×b1=(2×helix OD)×(helix height+OD). FIGS. 4C-D illustrate a pattern of metallic resonant elements 16 having an oblique pattern unit cell 46 or 48.

The dielectric carrier layer 12 includes any suitable substantially non-conductive material, including, for example, polymer materials such as, e.g., polycarbonate. PET, Acrylic. Teflon, vinyl, etc., ceramic materials such as, e.g., alumina, glass, strontium titanate, etc., composites including. e.g., polymer and solid metal materials, polymer and solid ceramic materials, intermixed ceramic and metal materials, etc. The adhesive surface 14 of the dielectric carrier layer 12 can include any suitable adhesive materials of a variety of adhesive types, such as, for example, pressure sensitive adhesives, hot melts, structural adhesives, solvent-based (including water-based) adhesives, curable adhesives (via thermal. UV, electron beam exposure). Adhesive chemical families include, for example, epoxies, polyurethanes, modified acrylics, cyanoacrylates, anaerobics, silicones, phenolics, imidazoles, ethylene/vinyl acetate copolymers, polyolefins, block copolymers, polyamides, polyesters, polyvinyl acetals, polyvinyl butyrals, polybutenes, thermoplastic elastomers, natural and synthetic rubber derivatives, polyacrylates, cellulosics, polyvinyl acetates, urea formaldehydes, melamine formaldehydes, phenol formaldehydes, styrene-butadiene rubbers, polychloroprenes, nitriles, acrylic acid esters, polyethers, epoxy acrylates, urethane acrylates.

In the present disclosure, materials in direct contact with the metallic resonant elements such as, e.g., a dielectric carrier layer and any securing material securing the metallic resonant elements to the dielectric carrier layer, are substantially non-conductive. The materials in contact with the metallic resonant elements may have a dielectric loss tangent, for example, in the range of 0.0001 to 0.1 at the frequency of interest.

An electromagnetic (EM) controlling article (e.g., a sheet structure 10 as shown in FIGS. 1A-B) can be made by various processes. In the embodiment depicted in FIG. 5A, a method of making an electromagnetic (EM) controlling sheet structure is provided. A transfer tool 510 is provided to include an array of pockets 512 on a major surface 511 thereof. Metallic resonant elements 16 are provided to reside in the array of pockets 512 of the transfer tool 510 to form a predetermined pattern. The metallic resonant elements 16 can be first disposed on the major surface 511 and then fill into the pockets 512 by any suitable method such as, for example, shaking, rubbing in using a brush, etc. The lateral size of the pockets (e.g., a length and a width) can be determined such that the resonant elements can have a loose fit as received by the pockets without easily escaping from the pockets. The pockets may have a depth comparable to the height of the resonant elements. The depth of the pockets may be in the range, for example, from about 0.1 mm to 10 mm. In the embodiment of FIG. 5A, the resonant elements 16 each have a height greater than the depth of the pockets such that a top portion projects from the pockets 512. In some embodiments, the height of resonant elements may be, for example, 10% to 90% greater than the depth of the pockets. With the resonant elements 16 in position, the dielectric carrier layer 12 is positioned to have its adhesive surface 14 overlaying the major surface 511 of the transfer tool 510 to contact the top portion of the resonant elements 16. The dielectric carrier layer 12 is then removed along with the resonant elements 16 from the major surface 511 of the transfer tool 510 to form the article 10.

Figure 5B:
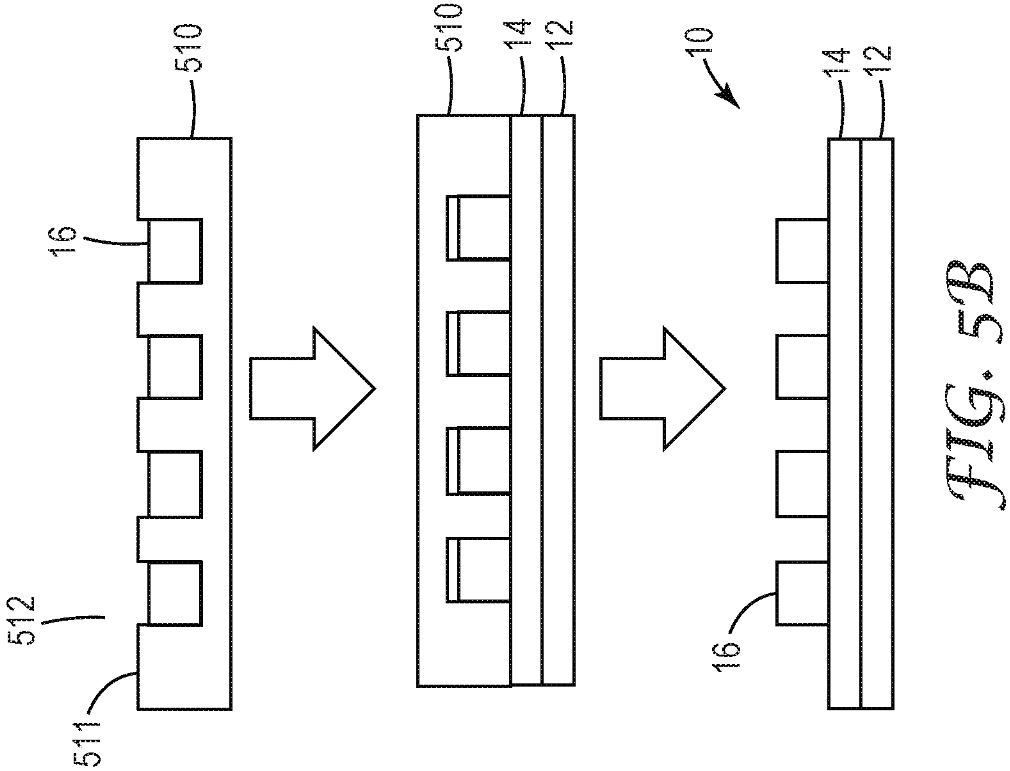
FIG. 5B is a schematic diagram of a process to make the article of FIGS. 1A-B, according to another embodiment.
Figure 5A:
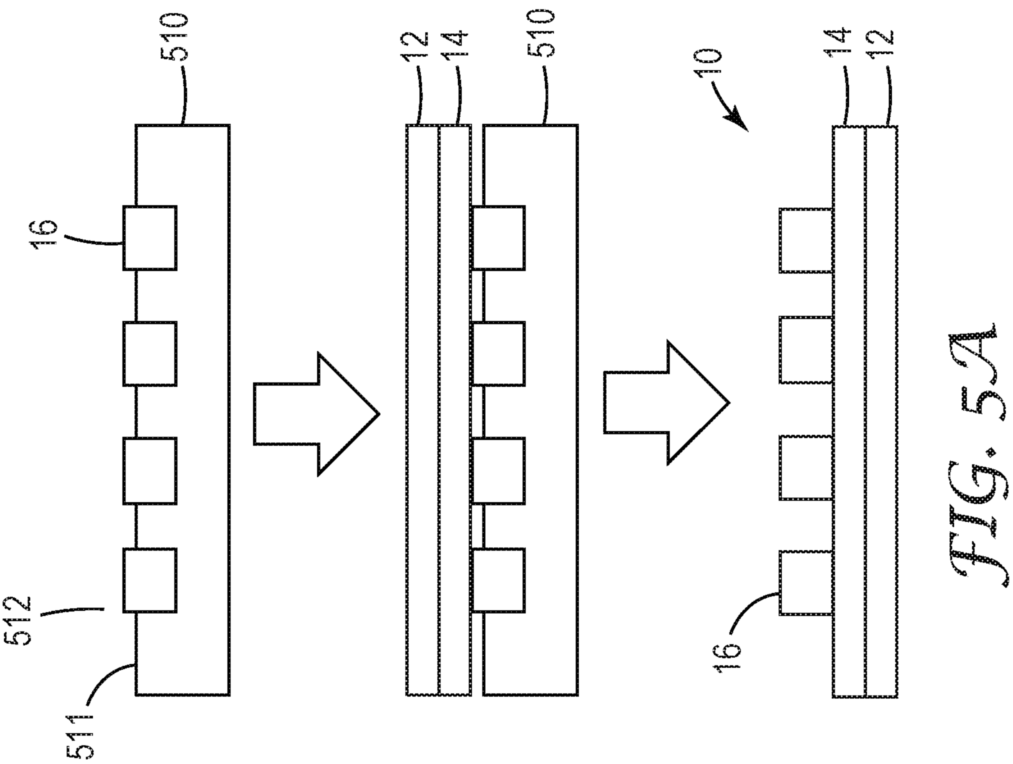
FIG. 5A is a schematic diagram of a process to make the article of FIGS. 1A-B, according to one embodiment.

In the embodiment depicted in FIG. 5B, another method of making the electromagnetic (EM) controlling sheet structure 10 is provided. The transfer tool 510 is provided to include an array of pockets 512 on the major surface 511 thereof. Metallic resonant elements 16 are provided to reside in the array of pockets 512 of the transfer tool 510 to form a predetermined pattern. The metallic resonant elements 16 can be first disposed on the major surface 511 and then fill into the pockets 512 by any suitable method such as, for example, shaking, rubbing in using a brush, etc. In the embodiment of FIG. 5B, the resonant elements 16 each have a height less than the depth of the pockets such that there is a space on top of the resonant elements when received by the pockets. In some embodiments, the height of resonant elements may be, for example, 100% to 110% less than the depth of the pockets. The size of a pocket can be determined such that the resonant elements received by the pockets can move, upon an exerted force, toward the adhesive surface 14 and make a contact with the adhesive surface 14 of the dielectric carrier layer 12. The resonant elements 16 can move upon a force such as, for example, a magnetic force, a gravity force, etc. When the resonant elements 16 are secured in position on the adhesive surface 14, the transfer tool 510 can be removed from the dielectric carrier layer 12 to form the article 10.

In some embodiments, a vacuum source can be provided to the transfer tool 510 to control the transfer of resonant elements 16. In the depicted embodiment of FIG. 5C, the transfer tool 510 includes holes 514 at the bottom of each pocket 512 that passes all the way through to the other side 513. The elements 16 can be disposed into the pockets 512 and then a vacuum source 52 can be provided to on the side 513 of the tool 510 to secure the elements in the pockets 512. With the vacuum on, the tool 510 can be inverted to place over the adhesive surface 14 without contacting the adhesive surface 14. The vacuum can be turned off so the elements 16 can fall out of the tool 510 and adhere onto the adhesive surface 14. It is to be understood that the vacuum source can be applied to various transfer tools in various embodiments.

Figure 6:
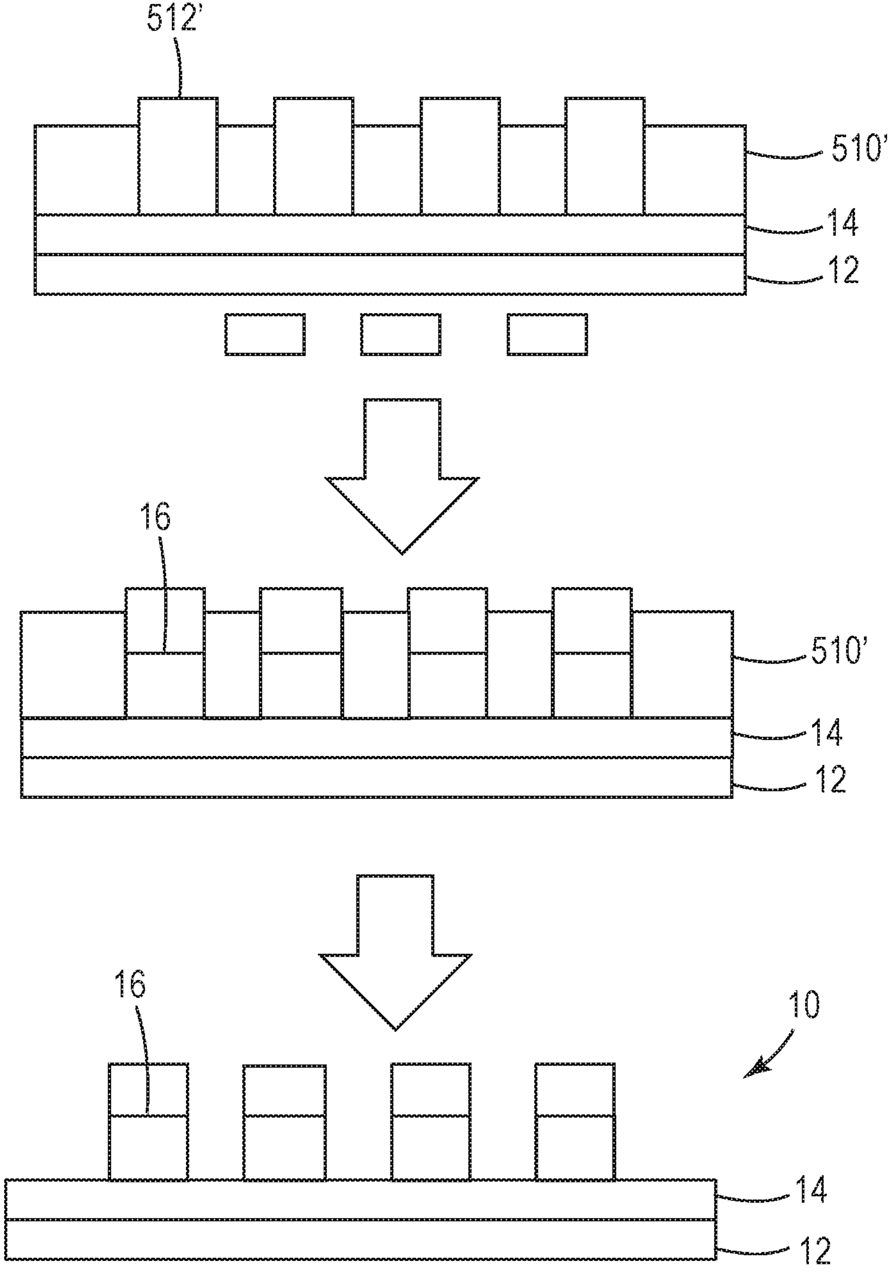
FIG. 6 is a schematic diagram of a process to make the article of FIGS. 1A-B, according to another embodiment.

In the embodiment depicted in FIG. 6, another method of making the electromagnetic (EM) controlling sheet structure 10 is provided. A transfer tool 510' is provided to include an array of pockets 512' which are through holes. The transfer tool 510' is disposed on the adhesive surface 14 of the dielectric carrier layer 12. Metallic resonant elements 16 are provided to pass through the array of pockets 512' of the transfer tool 510' by any suitable method such as, for example, shaking, rubbing in using a brush, etc. In the embodiment of FIG. 6, the resonant elements 16 each have a height less than the depth of the pockets such that there is a space on top of the resonant elements when received by the pockets. The size of a pocket can be determined such that the resonant elements can pass through the pockets, move toward the adhesive surface 14, and make a contact with the adhesive surface 14 of the dielectric carrier layer 12. When the resonant elements 16 are secured in position on the adhesive surface 14, the transfer tool 510' can be removed from the dielectric carrier layer 12 to form the article 10.

Figure 8:
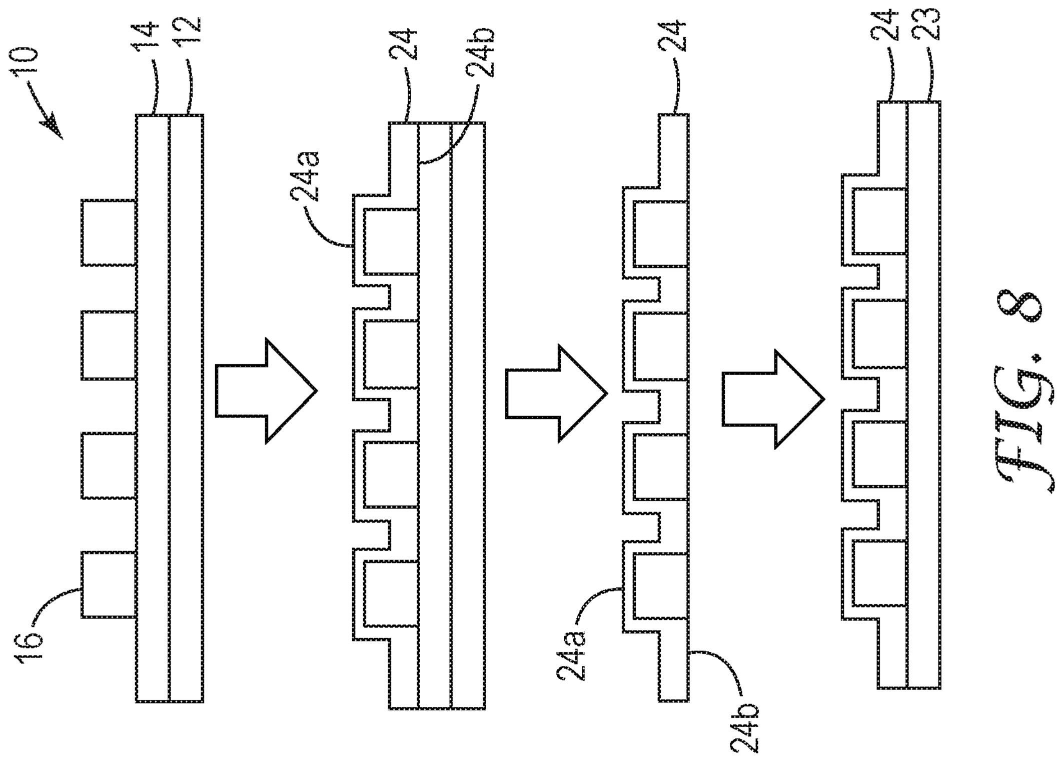
FIG. 8 is a schematic diagram of a process to make an article based on the article of FIGS. 1A-B, according to one embodiment.
Figure 7:
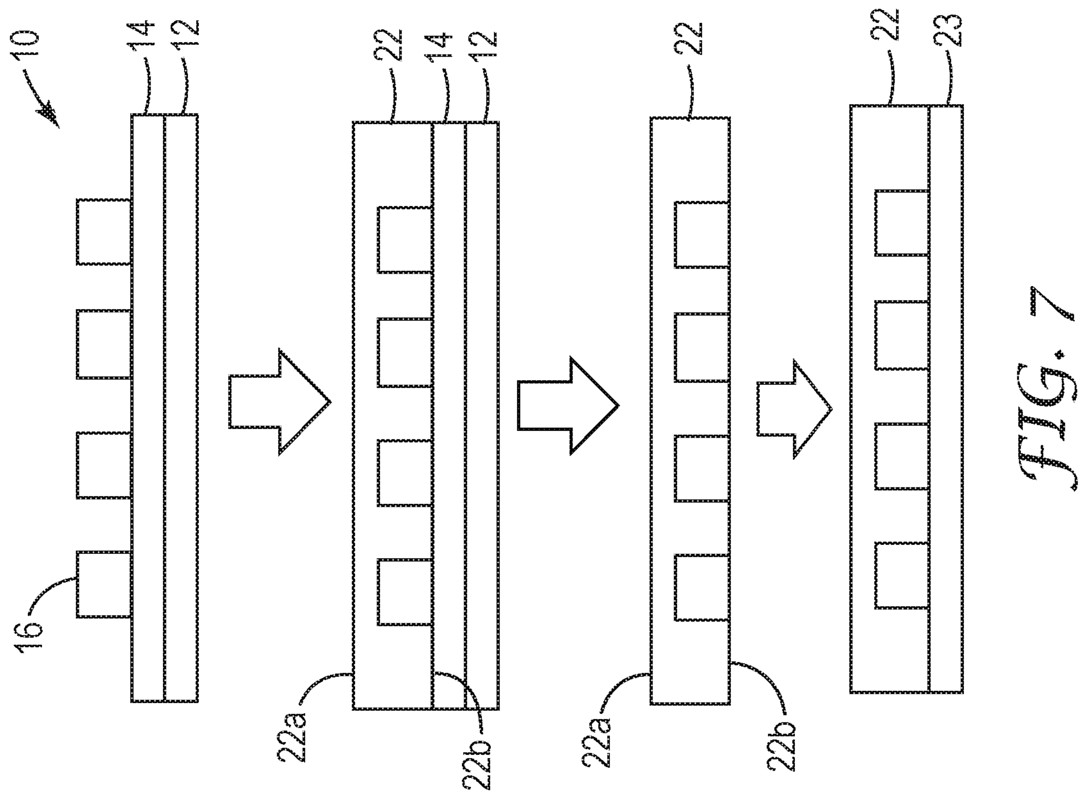
FIG. 7 is a schematic diagram of a process to make an article based on the article of FIGS. 1A-B, according to one embodiment.

A pattern of resonant elements can be further secured by various methods. In the embodiments of FIGS. 7 and 8, a resin material 22 or 24 is applied on the major surface of the article 10 to at least partially bury the resonant elements 16 on the adhesive surface 14. The resin material 22 or 24 may be applied by various methods such as, for example, coating in a dissolved state with a solvent then evaporating the solvent, coating in a heated thermoplastic state then cooling, hot roll laminating a thermoplastic dry film, curing the resin by applying heat, UV, or electron beam radiation, spray coating in a liquid or powder form. The resin material can include any suitable adhesive materials of a variety of adhesive types, such as, for example, pressure sensitive adhesives, hot melts, structural adhesives, solvent-based (including water-based) adhesives, curable adhesives (via thermal, UV, electron beam exposure). Adhesive chemical families include, for example, epoxies, polyurethanes, modified acrylics, cyanoacrylates, anaerobics, silicones, phenolics, imidazoles, ethylene/vinyl acetate copolymers, polyolefins, block copolymers, polyamides, polyesters, polyvinyl acetals, polyvinyl butyrals, polybutenes, thermoplastic elastomers, natural and synthetic rubber derivatives, polyacrylates, cellulosics, polyvinyl acetates, urea formaldehydes, melamine formaldehydes, phenol formaldehydes, styrene-butadiene rubbers, polychloroprenes, nitriles, acrylic acid esters, polyethers, epoxy acrylates, urethane acrylates. In some embodiments, a flowable resin material can be applied on the adhesive surface 14, which can be dried or cured to form a solid layer to encapsulate the resonant elements 16. Suitable resin materials include, for example, pressure sensitive adhesives, hot melts, structural adhesives, solvent-based (including water-based) adhesives, curable adhesives (via thermal, UV, electron beam exposure). Adhesive chemical families include, for example, epoxies, polyurethanes, modified acrylics, cyanoacrylates, anaerobics, silicones, phenolics, imidazoles, ethylene/vinyl acetate copolymers, polyolefins, block copolymers, polyamides, polyesters, polyvinyl acetals, polyvinyl butyrals, polybutenes, thermoplastic elastomers, natural and synthetic rubber derivatives, polyacrylates, cellulosics, polyvinyl acetates, urea formaldehydes, melamine formaldehydes, phenol formaldehydes, styrene-butadiene rubbers, polychloroprenes, nitriles, acrylic acid esters, polyethers, epoxy acrylates, urethane acrylates.

In the embodiment of FIG. 7, the resin material 22 has a substantially flat upper surface 22*a* and a substantially flat bottom surface 22*b*. In the embodiment of FIG. 8, the resin material 24 has an upper surface 24*a* substantially conformal to the resonant elements 16 attached to the adhesive surface 14. The bottom surface 22*b*, 24*b* is in contact with the adhesive surface 14. When the support layer 12 along with the adhesive surface 14 is removed, the bottom surface 22*b*, 24*b* of the resin layer 22, 24 is revealed. In some embodiments, a second resin layer 23 can be provided to cover the bottom 22*b*, 24*b* such that the resonant elements 16 are encapsulated by the first resin layer 22, 24 and the second resin layer 23.

Figure 9B:
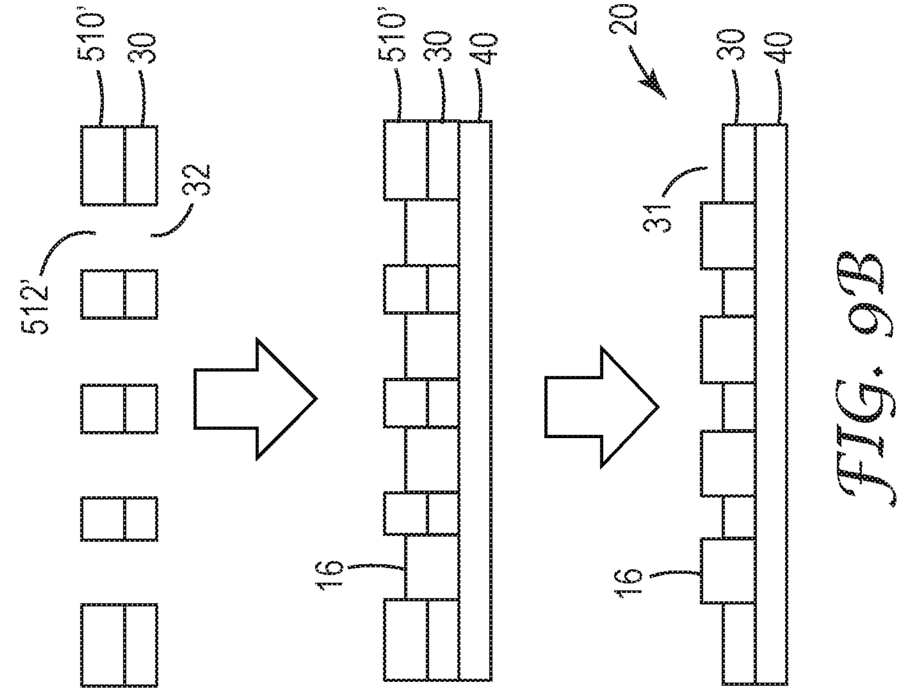
FIG. 9B is a schematic diagram of a process to make an article, according to another embodiment.
Figure 9A:
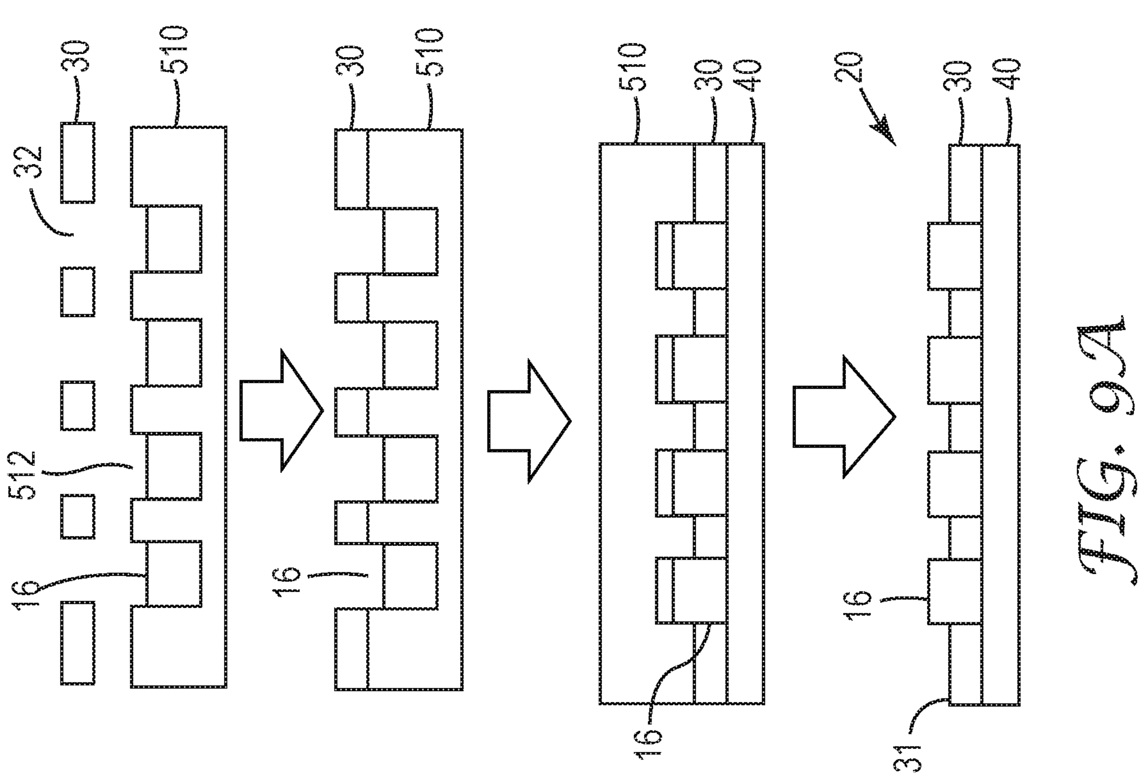
FIG. 9A is a schematic diagram of a process to make an article, according to one embodiment.

FIG. 9A is a schematic diagram of a process to make an article 20, according to one embodiment. The pattern of resonant elements 16 are received by the pockets 512 of the transfer tool 510. The resonant elements 16 each have a height less than the depth of the pockets such that there is a space on top of the resonant elements when received by the pockets 512. A dielectric carrier layer 30 is provided onto the major surface 511 of the transfer tool 510. The dielectric carrier layer 30 has a pattern of through-holes 32 which are aligned with the openings of the pockets 512 of the transfer tool 510. The through-holes 32 have a lateral size suitable for the resonant elements 16 to pass through when the transfer tool 510 flips over. A support layer 40 is provided to support the resonant elements 16 which are received by the through-holes 32 of the dielectric carrier layer 30. The transfer tool 510 is then removed from the support layer 40 to form the article 20, where the pattern of resonant elements 16 is received by the through-holes 32 of the dielectric carrier layer 30 which is supported by the support layer 40. The resonant elements 16 each have a height greater than the depth of the through-holes 32 such that the top portion of the resonant elements 16 projects from the dielectric carrier layer 30 on the side 31 of the dielectric carrier layer 30. In some embodiments, the top portion projecting from the side 31 may be about 5% to about 100% of the height of the resonant elements.

FIG. 9B is a schematic diagram of another process to make the article 20, according to another embodiment. A transfer tool 510' is provided to include an array of pockets 512' which are through holes. The transfer tool 510' is disposed on the dielectric carrier layer 30, where the through holes 512' of the transfer tool 510' are aligned with the through-holes 32 of the dielectric carrier layer 30. Metallic resonant elements 16 are provided on the surface 511' of the transfer tool 510 to pass through the array of pockets 512' by any suitable method such as, for example, shaking, rubbing in using a brush, etc. The size of the through holes 512', 32 can be determined such that the resonant elements 16 can pass through the through holes, move toward the underneath the support layer 40. The transfer tool 510' is then removed from the support layer 40 to form the article 20, where the pattern of resonant elements 16 is received by the through-holes 32 of the dielectric carrier layer 30 which is supported by the support layer 40.

Figure 10B:
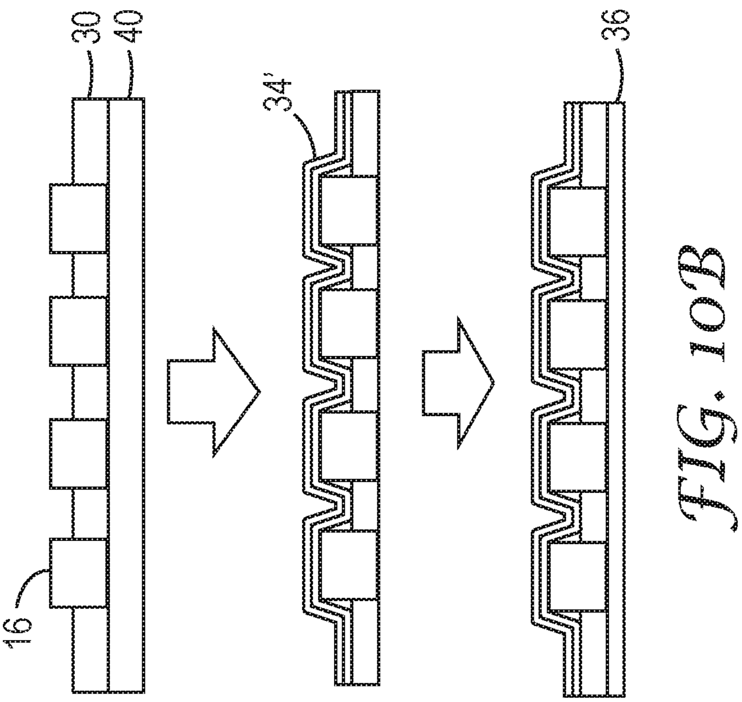
FIG. 10B is a schematic diagram of a process to make an article, according to another embodiment.
Figure 10A:
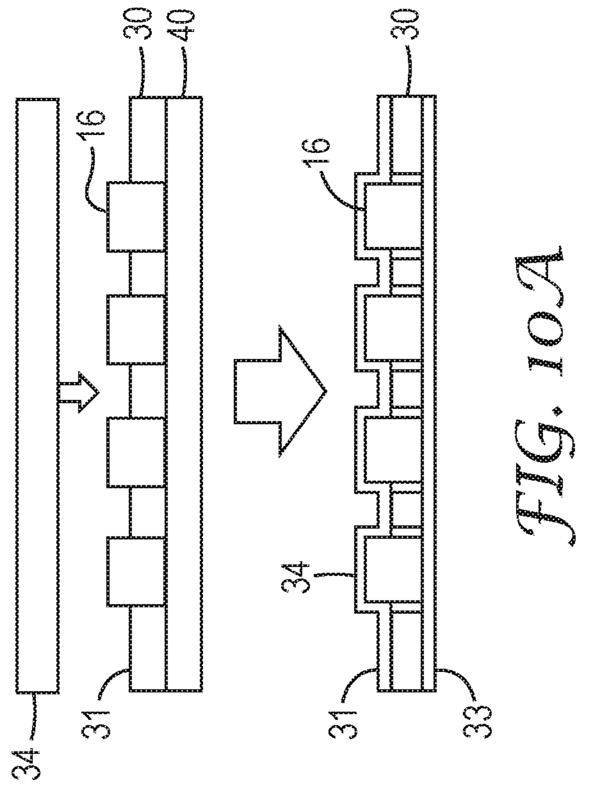
FIG. 10A is a schematic diagram of a process to make an article, according to one embodiment.

The article 20 can be modified to form various articles. In the embodiments of FIG. 10A, a resin material 34 is applied onto the side 31 of the dielectric carrier layer 30 to secure the resonant elements 16 in the dielectric carrier layer 30. The resin material 34 can be a low viscosity resin and it can flow into the gap between the sidewall of the through-holes of the dielectric carrier layer 30 and the resonant elements 16 received in the through-holes to further secure the resonant elements 16 in place. In the embodiment of FIG. 10B, an adhesive tape 34' is attached to the dielectric carrier layer 30 to cover the pattern of metallic resonant elements 16. After the resonant elements 16 are secured in the through-holes 32 of the dielectric carrier layer 30, the support layer 40 can be removed to reveal the side 33 of the dielectric carrier layer 30 opposite the side 31. A second resin layer or adhesive tape 36 is applied on the side 33 of the dielectric carrier layer 30 to further secure the resonant elements 16 in the through-holes 32 of the dielectric carrier layer 30.

Articles described herein including an array of metallic resonant elements supported by a dielectric carrier layer in a non-random pattern can be used in various applications. In one embodiment, a metallic layer can be provided on the dielectric carrier layer to form an electromagnetic interference (EMI) absorber configured to absorb an electromagnetic (EM) radiation in the range of 1 GHz to 100 GHz. In one embodiment, an EM antenna can be formed by a metallic layer formed on dielectric weather metallic layer is continuous or has specially designed apertures (parts without a metal). In one embodiment, a reflect array formed by at least 2 resonant elements with different resonant frequency and provided that dielectric layer backed with continuous metallic layer.

Various embodiments are provided that are reflectarray films, portions of the reflectarray films, methods of making at least a portion of the reflectarray films, and methods of using the reflectarray films.

Embodiment 1 is a method of making a sheet structure to control an electromagnetic (EM) radiation in the range of 1 GHz to 100 GHz, the method comprising:

providing a transfer tool including an array of pockets on a major surface thereof;

disposing a plurality of metallic resonant elements in the array of pockets of the transfer tool;

contacting an adhesive surface of a dielectric carrier layer to the plurality of metallic resonant elements in the array of pockets on the major surface of the transfer tool; and removing the dielectric carrier layer along with the plurality of metallic resonant elements from the major surface of the transfer tool, wherein the plurality of metallic resonant elements is disposed on the dielectric carrier layer in a non-random pattern, and the plurality of metallic resonant elements is oriented such that each metallic resonant element has an axis substantially parallel to each other and substantially parallel to a major plane of the dielectric carrier layer.

Embodiment 2 is the method of embodiment 1, wherein the metallic resonant elements comprise one or more helical elements.

Embodiment 3 is the method of embodiment 1 or 2, wherein the array of pockets each is configured to receive one metallic resonant element.

Embodiment 4 is the method of any one of embodiments 1-3, wherein the major surface of the transfer tool is a non-adhesive surface.

Embodiment 5 is the method of any one of embodiments 1-4, wherein the dielectric carrier layer comprises one or more substantially non-conductive materials having a dielectric loss tangent within 0.0001 to 0.1 for frequency in range 1 GHz to 100 GHz.

Embodiment 6 is the method of any one of embodiments 1-5, wherein the non-random pattern includes at least one of a simple rectangle (SR) pattern, a centered rectangle (CR) pattern, an oblique pattern, a hexagonal square pattern, a honeycomb pattern.

Embodiment 7 is the method of any one of embodiments 1-6, wherein the metallic resonant elements comprise at least one of a conducting wire, a strand of polymer material coated with a conductive layer, or a biomaterial coated with a conductive layer.

Embodiment 8 is the method of any one of embodiments 1-7, wherein the metallic resonant elements each have a conductive length in a range from about $\lambda/4$ to about $10\lambda$, where $\lambda$ is the free-space wavelength of a minimum frequency of operation.

Embodiment 9 is the method of any one of embodiments 1-8, further comprising providing a resin material to encapsulate the metallic resonant elements on the dielectric carrier layer.

Embodiment 10 is the method of any one of embodiments 1-9, further comprising providing a metallic layer on the dielectric carrier layer on the side opposite the adhesive layer.

Embodiment 11 is an electromagnetic (EM) controlling sheet structure comprising:

a dielectric carrier layer comprising an adhesive surface; and a plurality of metallic resonant elements attached to the adhesive surface of the dielectric carrier layer to form an EM metamaterial structure in a non-random pattern, wherein the plurality of metallic resonant elements is oriented such that each metallic resonant element has an axis substantially parallel to each other and substantially parallel to a major plane of the dielectric carrier layer.

Embodiment 12 is the EM controlling sheet structure of embodiment 11, wherein the metallic resonant elements comprise one or more helical elements.

Embodiment 13 is the EM controlling sheet structure of embodiment 11 or 12, wherein the dielectric carrier layer with the adhesive surface comprises one or more substantially non-conductive materials having a dielectric loss tangent within 0.0001 to 0.1 for frequency in range 1 GHz to 100 GHz.

Embodiment 14 is the EM controlling sheet structure of any one of embodiments 11-13, wherein the non-random pattern includes at least one of a simple rectangle (SR) pattern, a centered rectangle (CR) pattern, an oblique pattern, a hexagonal square pattern, or a honeycomb pattern.

Embodiment 15 is the EM controlling sheet structure of any one of embodiments 11-14, wherein the metallic resonant elements comprise at least one of a conductive wire including a conductive layer, a strand of polymer material coated with a conductive layer, or a biomaterial coated with a conductive layer.

Embodiment 16 is the EM controlling sheet structure of embodiment 15, wherein the conductive layer has a thickness greater than a skin depth thereof at a frequency of operation.

Embodiment 17 is the EM controlling sheet structure of embodiment 15 or 16, wherein the conductive layer comprises at least one of Cu, Al, Ag, W, Ti, Cr, Fe, or an alloy thereof.

Embodiment 18 is the EM controlling sheet structure of any one of embodiments 11-17, wherein the metallic resonant elements each have a conductive length in a range from about $\lambda/4$ to about $10\lambda$, where $\lambda$ is the free-space wavelength of a minimum frequency of operation.

Embodiment 19 is the EM controlling sheet structure of any one of embodiments 11-18, further comprising a resin material to encapsulate the metallic resonant elements on the dielectric carrier layer.

Embodiment 20 is the EM controlling sheet structure of any one of embodiments 11-19, wherein the metallic resonant elements comprise at least one of a conductive helical element, a metallic spheroid or bead, a metal coated plastic or ceramic spheroid with or without a hole in the center, or a conductive cylindrical element.

Embodiment 21 is a method of making a sheet structure to control an electromagnetic (EM) radiation in the range of 1 GHz to 100 GHz, the method comprising:

providing a transfer tool including an array of pockets on a major surface thereof;

disposing a dielectric carrier layer on the transfer tool, wherein the dielectric carrier layer includes an array of through holes aligned with the pockets of the transfer tool;

transferring, via the array of pockets of the transfer tool, a plurality of metallic resonant elements into the array of through holes of the dielectric carrier layer;

providing a support layer to support the dielectric carrier layer along with the plurality of resonant elements; and providing a cover layer to secure the resonant elements at least partially inside the through holes of the dielectric carrier layer; and removing the transfer tool from the dielectric carrier layer, wherein the plurality of metallic resonant elements is disposed in the array of through holes of the dielectric carrier layer in a non-random pattern, and the plurality of metallic resonant elements is oriented such that each metallic resonant element has an axis substantially parallel to each other and substantially parallel to a major plane of the dielectric carrier layer.

Embodiment 22 is an electromagnetic (EM) controlling sheet structure comprising:

a dielectric carrier layer comprising an array of through holes;

a plurality of metallic resonant elements received by the through holes of the dielectric carrier layer to form an EM metamaterial structure in a non-random pattern; and a securing layer disposed on the dielectric carrier layer to secure the metallic resonant elements in the through holes, wherein the plurality of metallic resonant elements is oriented such that each metallic resonant element has an axis substantially parallel to each other and substantially parallel to a major plane of the dielectric carrier layer.

Embodiment 23 is the sheet structure of embodiment 22, wherein the securing layer comprises at least one of an adhesive tape or a polymer film.

EXAMPLES

These examples are merely for illustrative purposes and are not meant to be limiting on the scope of the appended claims.

Examples

Example 1

Figure 5C:
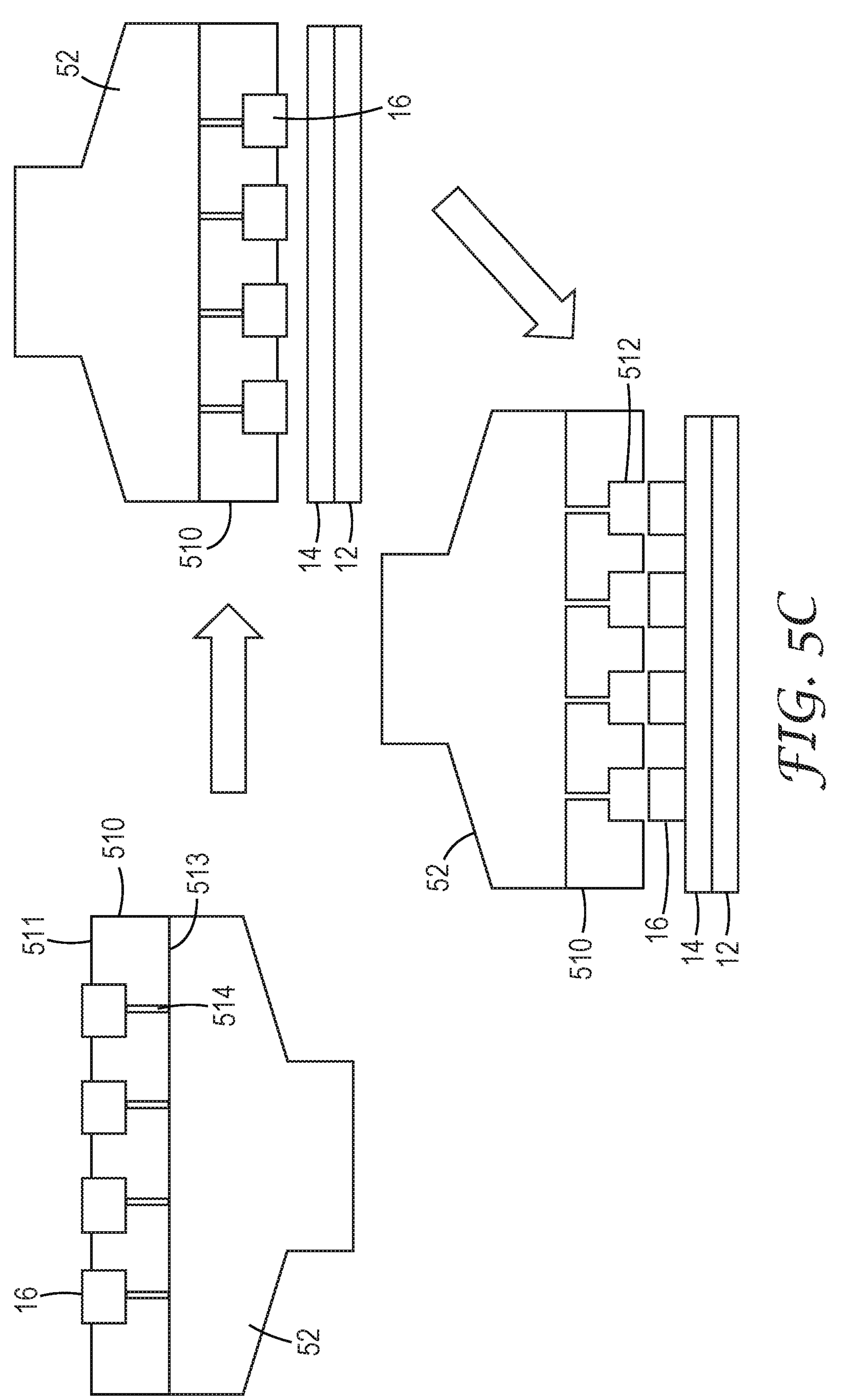
FIG. 5C is a schematic diagram of a process to make an article using a vacuum source, according to another embodiment.

Sample was built using springs commercially available from Lee Spring (Brooklyn, NY, USA), part number CB0040A-03-E (see Table 1 for more details). Springs were dispersed on top of the tool 510 (e.g., as shown in FIG. 5A, 5B or 5C) while the tool was shaken until pockets 510 were filled with springs. The excess of the springs on the surface of the tool was brushed away. Then 2-inch-wide 3M vinyl tape 471 (orange color) was applied over the tool, so that adhesive side of the tape was facing springs in the pockets. This tape also served as a carrier. To transfer springs to the tape the tool was rotated, placed onto flat surface, and then tapped, which helped for springs to fall off the pockets onto adhesive layer of the vinyl tape. After this, the tool was removed from the tape leaving a layer of arranged helixes on the surface of the tape. The springs were arranged in pattern shown in FIG. 4A.

The patterned tool (180 mm×180 mm×4 mm) with pockets (length 2.8 mm, width 0.75 mm, depth 0.8 mm) in pattern shown in FIG. 4A (0.58 mm distances between adjacent pockets) was printed with Accura 25 resin (3D Systems, Littleton, CO) via a stereolithography 3D printer (ProJet 7000HD, 3D Systems, Littleton, CO) machine. An excess of small springs (CB0040A-03-E, Lee Spring, Brooklyn, NY) were deposited onto the surface of the tool and were spread across the surface until all pockets in a 40 mm×40 mm area in the center contained a spring. The remaining springs were gently brushed off the surface. A vinyl tape (15.2 cm wide, Product number 471, 3M Company, Saint Paul, MN) was pressed over the top of the filled tooling, contacting the tape adhesive to the springs. The tape was then peeled off the tool and the springs remained stuck to the tape.

TABLE 1

| Springs | Height (mm) | OD (μm) | ID (um) | Wire D (μm) | Pitch (μm) | N-turns | Used in Examples |
|---|---|---|---|---|---|---|---|
| CB0040A 01 E | 1.276 | 582 | 382 | 100 | 130 | 7 | 3, 6 |
| CB0045A 03 E | 2.53 | 550 | 330 | 110 | 130 | 12 | 1, 2, 5 |
| CB0040A 05 E | 3.92 | 600 | 400 | 100 | 140 | 17 | 4, 7 |

Example 2-4

Example 2-3 were made by using a 125-um-thick PET as a carrier where pockets were laser cut to fit springs. The pockets were rectangular shape with the width equal to the spring outer diameter and the depth was about 10% over the spring's height. The springs were arranged into centered rectangular pattern according to FIG. 4A. The A resin material commercially available under the tradename "Polyvinyl Butyral" from Sigma-Aldrich Corp., St. Louis, MO, U.S., was used as to lock springs in place. For details on springs used see Table. 1.

Example 5-7

Example 5-7 were made by using a 125-um-thick PET as a carrier where pockets were laser cut to fit springs. The pockets were rectangular shape with the width equal to the spring outer diameter and the depth was about 10% over the spring's height. The springs were arranged into a simple rectangular pattern according to FIG. 4B. A resin material commercially available under the tradename "Polyvinyl Butyral" from Sigma-Aldrich Corp., St. Louis, MO, U.S., was used as to lock springs in place. For details on springs used see Table 1.

Test Methods

Electromagnetic Noise Suppression Test

The noise suppression performance of samples was tested using 50 Ohm microstripe line made of conventional FR4 board (1.57 mm thick and RF signal line width of 3.3 mm). Samples were cut into 0.9×0.4-inch rectangles and placed on top of the microstripe line so that the geometrical center of the sample corresponds to geometrical center of the microstripe line, and the longest side of the sample is parallel to the microstripe line. RF cables were used to connect microstripe line to the vector network analyzer Rohde & Schwarz ZNB20. VNA was set to measure full 4 port S parameters (S11, S22, S21, S12) and was calibrated following VNA manufacture's manual. The measured S-parameters were used to calculate flowing noise suppression characteristics, such as Insertion Loss and Power Loss. Insertion Loss is defined as IL=S21 [microstripe line as is]−S21 [microstripe line with sample] in dB scale. Here higher IL corresponds to a better noise suppression. Power loss is defined as $PL=1-|S11|^2-|S21|^2$, where a loss less case has PL=0 and a case with maximum loss is PL=1.

Free Space Measurement

Sample from Example 4 was placed against 12×12 inch aluminum plate so that vinyl is in direct contact with aluminum while helixes faces an incoming EM wave generated by focused beam antenna (from Compass Tech, Alpharetta, GA, USA, model number TT-2015-02). Reflection parameters S11 of sample against A1 plate and plate itself were recorded using VNA ZNB20 calibrated in accordance to manufacture manual. Return loss was calculated as RL=S21[A1 plate]−S21 (sample against A1 plate) in dB scale. Each measured S11 parameter was time gated to remove unwanted reflections from the surrounding elements. We used RF engineering library Scikit-rf (version 0.14.9) for Python programming language (version 3.7.3). Recorded S11 parameters were saved to standard VNA file format slp. These parameters were then loaded as RF networks using Network ('slp file') function from Scikit-rf library and time gated using Network.s21.time_gate (center=2.5, span=1.25) function with parameters set to, gating center and span, 2.5 ns and 1.2 ns, respectively. Gated S11 parameters were then used to calculate return loss, defined as RL=S11 [A1 plate]−S11 (sample against A1 plate) in dB scale.

Test Results

Figure 11:
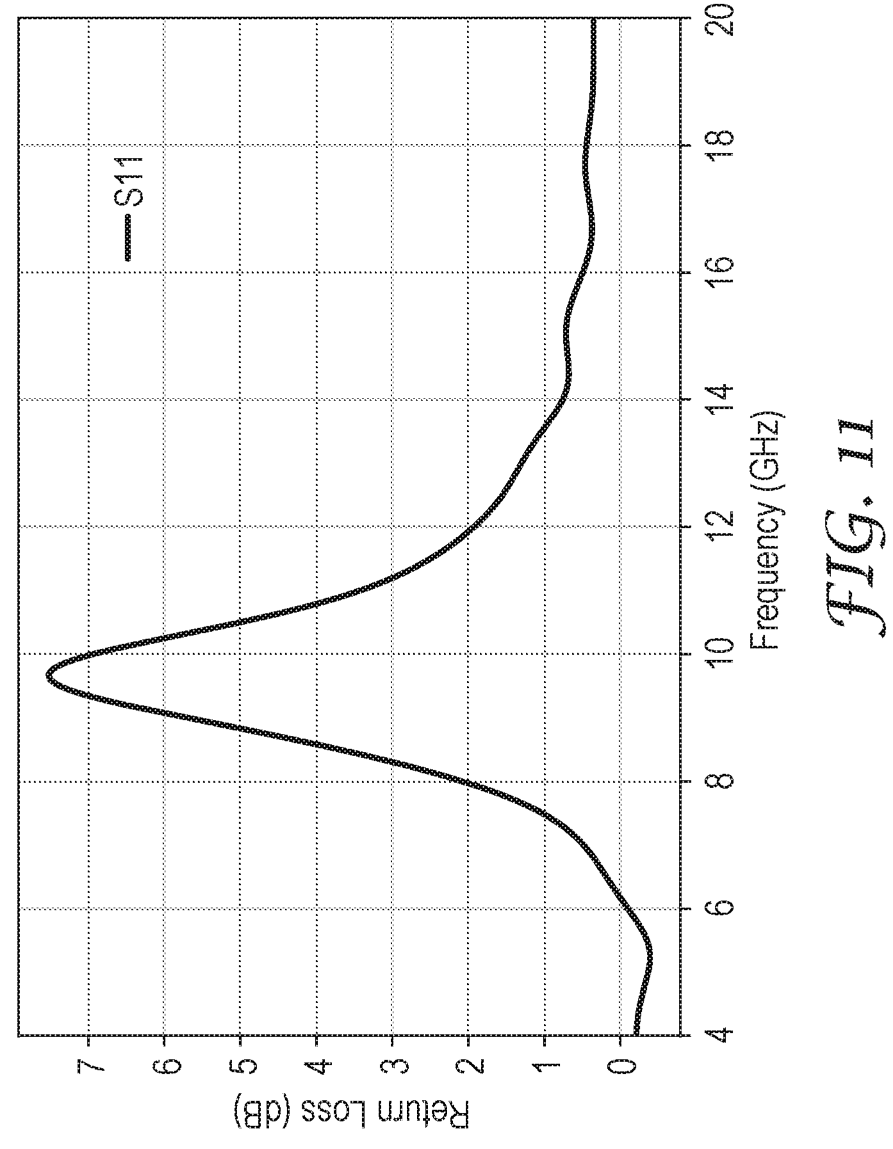
FIG. 11 is a plot of return loss versus frequency for Example 1.

FIG. 11 is a plot of return loss versus frequency for Example 1. FIG. 11 shows about 7.5 dB loss for reflected EM wave indicating good absorber performance. The response has clear peak at about 9.5 GHz with 3 dB bandwidth of 2.9 GHZ, which shows a frequency selectivity of absorber.

Figure 12A:
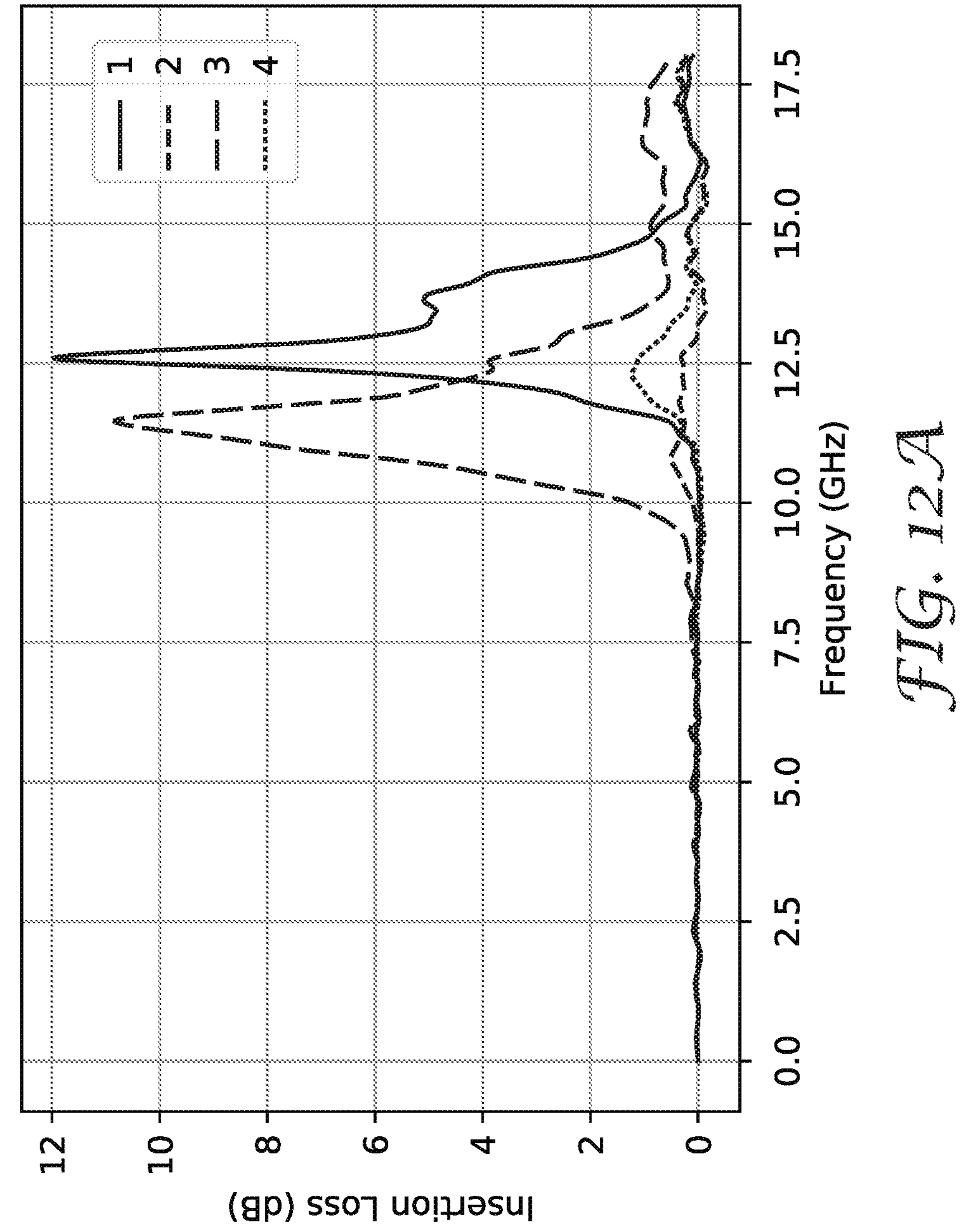
FIG. 12B is a plot of insertion loss versus frequence for Examples 3 and 6.
FIG. 12C is a plot of insertion loss versus frequence for Examples 4 and 7.
Figure 12B:
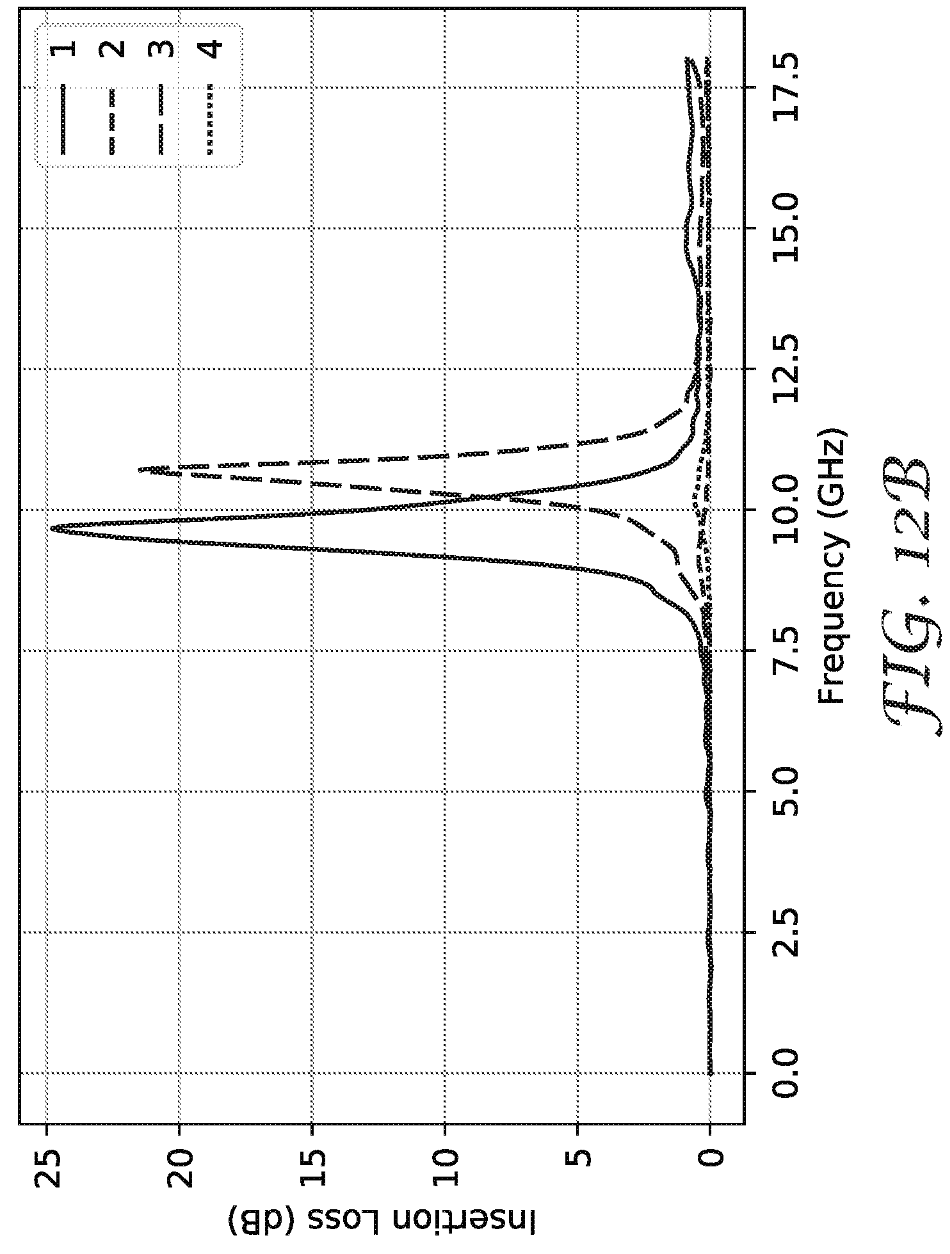
Figure 12C:
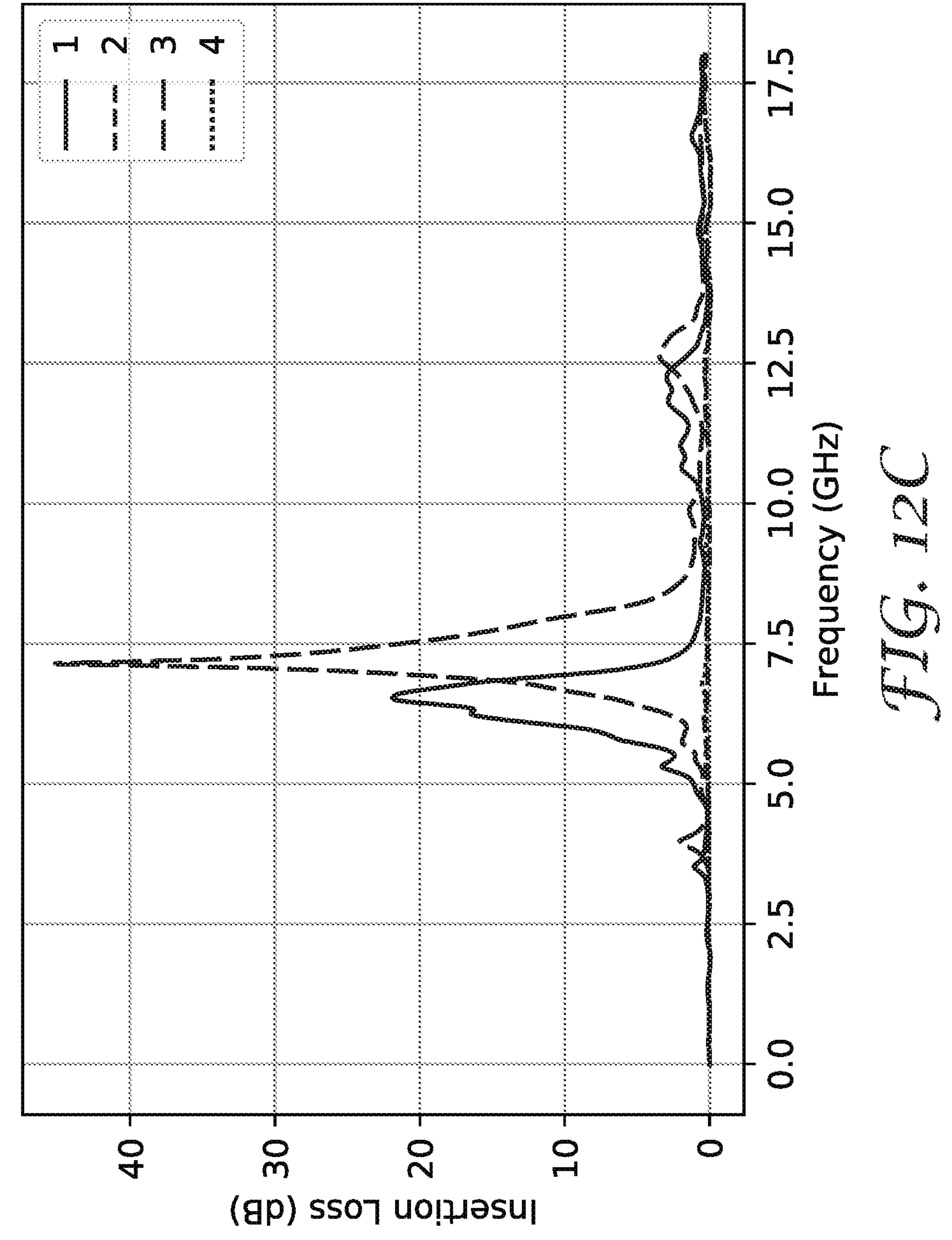
Figure 13A:
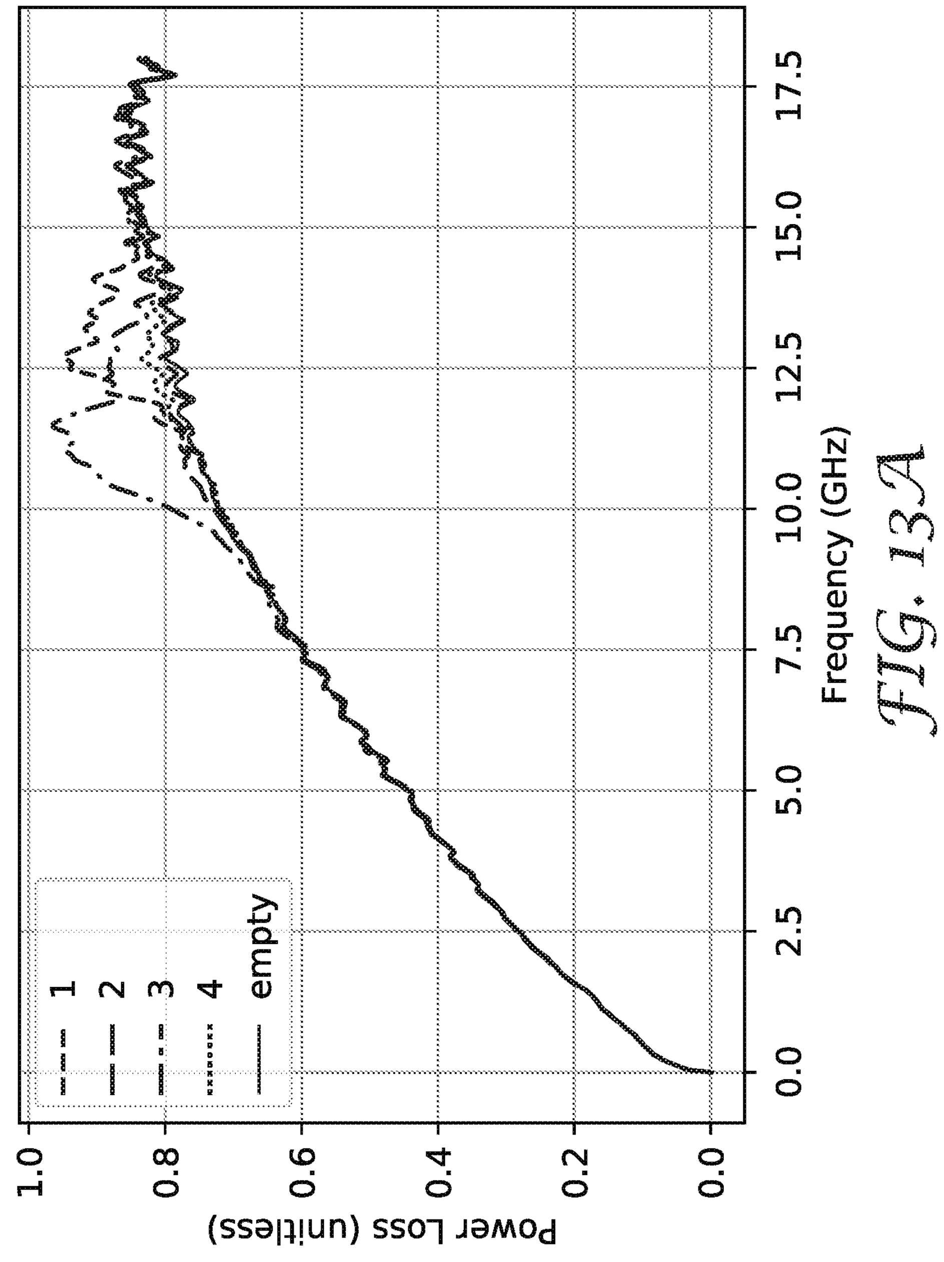
FIG. 13B is a plot of insertion loss versus frequence for Examples 3 and 6.
FIG. 13C is a plot of insertion loss versus frequence for Examples 4 and 7.
Figure 13B:
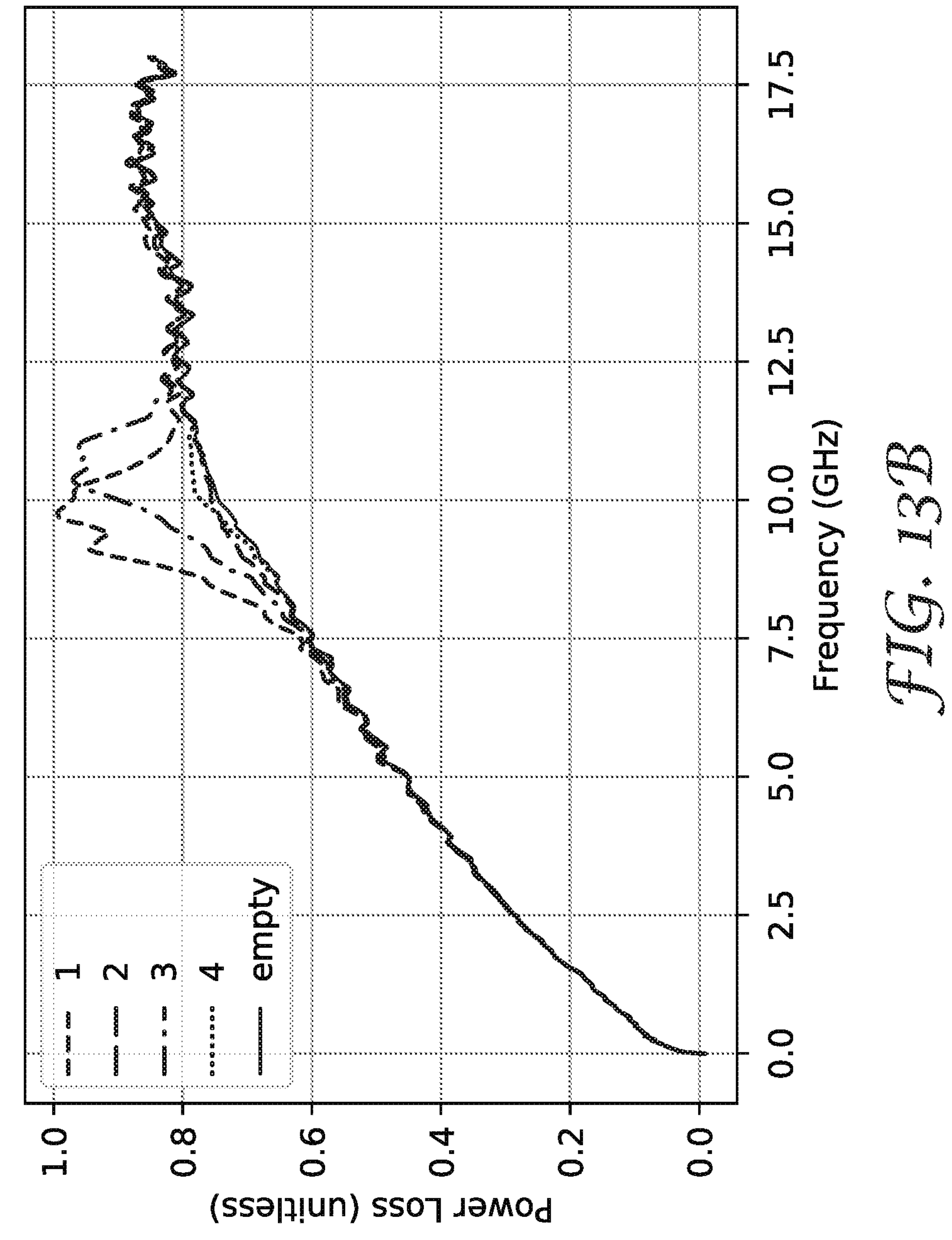
Figure 13C:
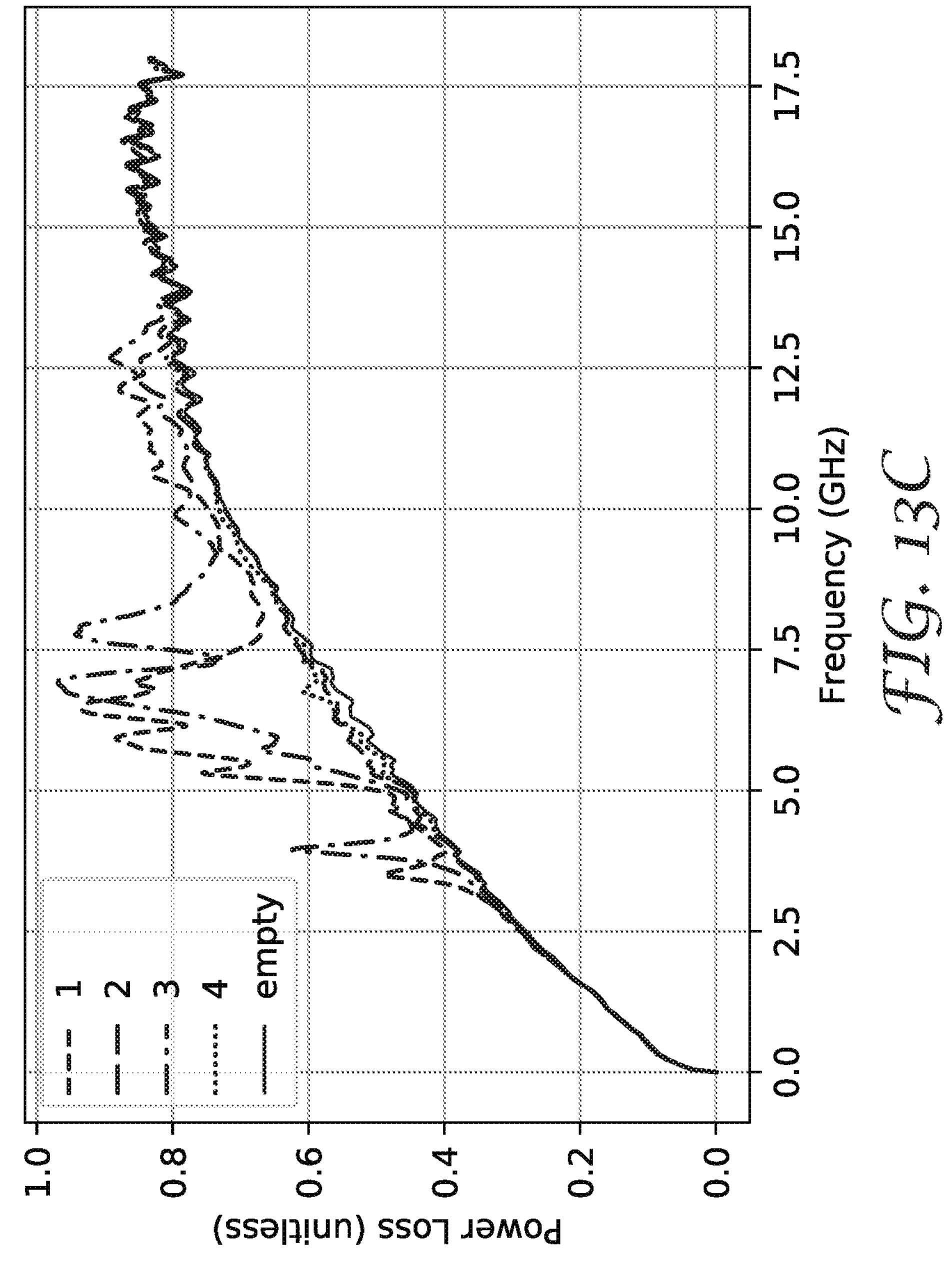

FIG. 12 is plots of insertion loss versus frequency for Examples. FIG. 13 is plots of power loss versus frequency for Examples. The sample information for FIGS. 12 and 13 is summarized in Table 2 below. FIGS. 12 and 13 show the test results of electromagnetic noise suppression, illustrating the insertion loss of constructions with helixes of different size and different arrangement.

TABLE 2

| Label | Example | Structure |
|---|---|---|
| a-1 | Example 2 | centered rectangular unit cell with helix axis perpendicular to microstripe line |
| a-2 | Example 2 | centered rectangular unit cell with helix axis parallel to microstripe line |
| a-3 | Example 5 | simple rectangular unit cell with helix axis perpendicular to microstripe line |
| a-4 | Example 5 | simple rectangular unit cell with helix axis parallel to microstripe line |
| b-1 | Example 3 | centered rectangular unit cell with helix axis perpendicular to microstripe line |
| b-2 | Example 3 | centered rectangular unit cell with helix axis parallel to microstripe line |
| b-3 | Example 6 | simple rectangular unit cell with helix axis perpendicular to microstripe line |
| b-4 | Example 6 | simple rectangular unit cell with helix axis parallel to microstripe line |
| c-1 | Example 4 | centered rectangular unit cell with helix axis perpendicular to microstripe line |
| c-2 | Example 4 | centered rectangular unit cell with helix axis parallel to microstripe line |
| c-3 | Example 7 | simple rectangular unit cell with helix axis perpendicular to microstripe line |
| c-4 | Example 7 | simple rectangular unit cell with helix axis parallel to microstripe line |

FIG. 12 demonstrates appreciable level of noise suppression for all examples, but only in cases where EM E-field is aligned with axis of helix, curve 1 and 3 in FIG. 12. For case where E-field is perpendicular to helix axis there is little to no effect on EM wave propagating in test fixture (low levels of IL in FIG. 12). The response also has a distinct frequency selectivity. The IL maximum depends on helix arrangement and helix length. Examples 2 and 5 with shorter helixes result in IL maximum at higher frequency while longer examples with longer shift IL maximum to lower frequencies. The intermediate length helixes result in IL maximum in between of two latter cases. This length dependence is in a good agreement with resonance condition $k+l=n*\pi$ mentioned earlier.

What is claimed is:

1. A method of making a sheet structure to control an electromagnetic (EM) radiation in the range of 1 GHz to 100 GHz, the method comprising:
- providing a transfer tool including an array of pockets on a major surface thereof;
- disposing a plurality of metallic resonant elements in the array of pockets of the transfer tool;
- contacting an adhesive surface of a dielectric carrier layer to the plurality of metallic resonant elements in the array of pockets on the major surface of the transfer tool; and
- removing the dielectric carrier layer along with the plurality of metallic resonant elements from the major surface of the transfer tool,
- wherein the plurality of metallic resonant elements is disposed on the dielectric carrier layer in a non-random pattern, and the plurality of metallic resonant elements is oriented such that each metallic resonant element has an axis substantially parallel to each other and substantially parallel to a major plane of the dielectric carrier layer.

2. The method of claim 1, wherein the metallic resonant elements comprise at least one of a conductive helical element, a metallic spheroid or bead, a metal coated plastic or ceramic spheroid with or without a hole, or a conductive cylindrical element.

3. The method of claim 2, wherein the conductive helical element comprises at least one of a conducting wire, a strand of polymer material coated with a conductive layer, or a biomaterial coated with a conductive layer.

4. The method of claim 1, wherein the array of pockets each is configured to receive one metallic resonant element.

5. The method of claim 1, wherein the major surface of the transfer tool is a non-adhesive surface.

6. The method of claim 1, wherein the dielectric carrier layer comprises one or more substantially non-conductive materials having a dielectric loss tangent within 0.0001 to 0.1 for frequency in range 1 GHz to 100 GHz.

7. The method of claim 1, wherein the non-random pattern includes at least one of a simple rectangle (SR) pattern, a centered rectangle (CR) pattern, an oblique pattern, a hexagonal square pattern, or a honeycomb pattern.

8. The method of claim 1, wherein the metallic resonant elements each have a conductive length in a range from about $\lambda/4$ to about 10 $\lambda$, where $\lambda$ is the free-space wavelength of a minimum frequency of operation.

9. The method of claim 1, further comprising providing a resin material to encapsulate the metallic resonant elements on the dielectric carrier layer.

10. The method of claim 1, further comprising providing a metallic layer on the dielectric carrier layer on the side opposite the adhesive layer.

11. An electromagnetic (EM) controlling sheet structure comprising:
- a dielectric carrier layer comprising an adhesive surface; and
- a plurality of three-dimensional metallic resonant elements attached to the adhesive surface of the dielectric carrier layer to form an EM metamaterial structure in a non-random pattern,
- wherein the plurality of three-dimensional metallic resonant elements is oriented such that each three-dimensional metallic resonant element has an axis substantially parallel to each other and substantially parallel to a major plane of the dielectric carrier layer.

12. The EM controlling sheet structure of claim 11, wherein the three-dimensional metallic resonant elements comprise at least one of a conductive helical element, a metallic spheroid or bead, a metal coated plastic or ceramic spheroid with or without a hole, or a conductive cylindrical element.

13. The EM controlling sheet structure of claim 11, wherein the three-dimensional metallic resonant elements comprise at least one of a conductive wire including a conductive layer, a strand of polymer material coated with a conductive layer, or a biomaterial coated with a conductive layer.

14. The EM controlling sheet structure of claim 11, wherein the dielectric carrier layer with the adhesive surface comprises one or more substantially non-conductive materials having a dielectric loss tangent within 0.0001 to 0.1 for frequency in range 1 GHz to 100 GHz.

15. The EM controlling sheet structure of claim 11, wherein the non-random pattern includes at least one of a simple rectangle (SR) pattern, a centered rectangle (CR) pattern, an oblique pattern, a hexagonal square pattern, or a honeycomb pattern.

16. The EM controlling sheet structure of claim 11, wherein the three-dimensional metallic resonant elements each have a conductive length in a range from about $\lambda/4$ to about 10 $\lambda$, where $\lambda$ is the free-space wavelength of a minimum frequency of operation.

17. The EM controlling sheet structure of claim 11, further comprising a resin material to encapsulate the three-dimensional metallic resonant elements on the dielectric carrier layer.

18. A method of making a sheet structure to control an electromagnetic (EM) radiation in the range of 1 GHz to 100 GHz, the method comprising:

providing a transfer tool including an array of pockets on a major surface thereof;

disposing a dielectric carrier layer on the transfer tool, wherein the dielectric carrier layer includes an array of through holes aligned with the pockets of the transfer tool;

transferring, via the array of pockets of the transfer tool, a plurality of metallic resonant elements into the array of through holes of the dielectric carrier layer;

providing a support layer to support the dielectric carrier layer along with the plurality of resonant elements; and providing a cover layer to secure the resonant elements at least partially inside the through holes of the dielectric carrier layer; and removing the transfer tool from the dielectric carrier layer, wherein the plurality of metallic resonant elements is disposed in the array of through holes of the dielectric carrier layer in a non-random pattern, and the plurality of metallic resonant elements is oriented such that each metallic resonant element has an axis substantially parallel to each other and substantially parallel to a major plane of the dielectric carrier layer.

* * * * *